(12) United States Patent
Walke et al.

(10) Patent No.: US 11,108,410 B1
(45) Date of Patent: Aug. 31, 2021

(54) USER-PROGRAMMABLE LDPC DECODER

(71) Applicant: Xilinx, Inc., San Jose, CA (US)

(72) Inventors: Richard L. Walke, Edinburgh (GB); Christopher H. Dick, San Jose, CA (US); Nihat E. Tunali, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 120 days.

(21) Appl. No.: 16/112,588

(22) Filed: Aug. 24, 2018

(51) Int. Cl.
*H03M 13/11* (2006.01)
*H03M 13/15* (2006.01)
*H03M 13/09* (2006.01)

(52) U.S. Cl.
CPC ......... *H03M 13/118* (2013.01); *H03M 13/09* (2013.01); *H03M 13/116* (2013.01); *H03M 13/15* (2013.01)

(58) Field of Classification Search
CPC .... H03M 13/118; H03M 13/09; H03M 13/15; H03M 13/116
See application file for complete search history.

(56) References Cited

U.S. PATENT DOCUMENTS

| | | | |
|---|---|---|---|
| 7,539,926 B1 | 5/2009 | Lesea | |
| 7,730,377 B2 | 6/2010 | Hocevar | |
| 8,065,598 B1 * | 11/2011 | Gunnam | H03M 13/116 714/800 |
| 8,140,932 B2 | 3/2012 | Blankenship | |
| 8,291,283 B1 | 10/2012 | Rad et al. | |
| 8,429,483 B1 | 4/2013 | Varnica et al. | |
| 8,438,459 B2 | 5/2013 | Cho et al. | |
| 8,489,957 B2 | 7/2013 | Wesel et al. | |
| 8,612,835 B2 | 12/2013 | Yokokawa | |
| 8,713,397 B2 | 4/2014 | Yang et al. | |
| 8,751,902 B2 | 6/2014 | Jin et al. | |
| 8,984,376 B1 | 3/2015 | Norrie | |
| 9,083,383 B1 | 7/2015 | Tunali et al. | |
| 9,203,440 B1 | 12/2015 | Tunali et al. | |

(Continued)

OTHER PUBLICATIONS

Mansour, A., Turbo-Decoding Message-Passing Algorithm for Sparse Parity-Check Matrix Codes, IEEE Transations of Signal Processing, vol. 54, No. 11, Nov. 2006, pp. 4376-4392.

(Continued)

*Primary Examiner* — April Y Blair
*Assistant Examiner* — Rong Tang
(74) *Attorney, Agent, or Firm* — Paradice and Li LLP

(57) ABSTRACT

A decoder circuit includes a low-density parity-check (LDPC) repository, an LDPC code configurator, and LDPC decoding circuitry. The LDPC repository stores parity-check information associated with one or more LDPC codes. The LDPC code configurator may receive a first LDPC configuration describing a parity-check matrix for a first LDPC code and may update the parity-check information in the LDPC repository to reflect the parity-check matrix for the first LDPC code. The LDPC decoding circuitry may receive a first codeword encoded in accordance with the LDPC code. More specifically, the LDPC decoding circuitry may be configured to read the parity-check information associated with the first LDPC code from the LDPC repository and iteratively decode the first codeword using the parity-check information associated with the first LDPC code.

16 Claims, 15 Drawing Sheets

(56) References Cited

U.S. PATENT DOCUMENTS

| | | |
|---|---|---|
| 9,413,390 B1 | 8/2016 | Yin et al. |
| 9,548,759 B1 * | 1/2017 | Rad ................. H03M 13/116 |
| 9,577,675 B1 * | 2/2017 | Varnica ............. H03M 13/116 |
| 9,667,276 B1 | 5/2017 | Tunali et al. |
| 2007/0220395 A1 | 9/2007 | Nimbalker et al. |
| 2008/0077843 A1 | 3/2008 | Cho et al. |
| 2008/0263425 A1 | 10/2008 | Lakkis |
| 2013/0031438 A1 | 1/2013 | Hu et al. |
| 2013/0061112 A1 | 3/2013 | Chen et al. |
| 2013/0139023 A1 | 5/2013 | Han et al. |
| 2014/0101510 A1 | 4/2014 | Wang et al. |
| 2014/0181612 A1 | 6/2014 | Gunnam et al. |
| 2015/0058692 A1 | 2/2015 | Bennatan et al. |
| 2015/0227419 A1 | 8/2015 | Sakaue et al. |
| 2016/0055057 A1 | 2/2016 | Shin et al. |
| 2018/0159555 A1 | 6/2018 | Ryabinin et al. |
| 2019/0080223 A1 | 3/2019 | Fraser et al. |

OTHER PUBLICATIONS

Emran et al., Simplified Variable-Scaled Min Sum LDPC Decoder for irregular LDPC Codes, Electronics and Communications Engineering Department, E-JUST University, CNNC: Networking Issues in Multimedia Entertainment, 2014, pp. 518-523.

U.S. Appl. No. 15/688,628, filed Aug. 28, 2017, Tunali, E. et al., "Systems and Methods for Decoding Quasi-Cyclic (QC) Low-Density Parity-Check (LDPC) Codes".

U.S. Appl. No. 15/938,760, filed Mar. 28, 2018, Walke, R. et al., Efficient Method for Packing LDPC Decode Operations.

Xilinx, Inc., Soft-Decision FEC Integrated Block v1.1, LogiCORE IP Product Guide, PG256, Apr. 4, 2018, pp. 1-134, San Jose, CA USA.

Xilinx, Inc., Zynq UltraScale+ RFSoc Data Sheet: Overview, Advance Product Specification, DS889 v1.5, Jul. 23, 2018, pp. 1-33, San Jose, CA USA Zynq RFSoC https://www.xilinx.com/products/silicon-devices/soc/rfsoc.html.

Tsatsaragkos et al., "A Flexible Layered LDPC Decoder," 2011, 8th International Symposium on Wireless Communication Systems, Aachen, 2011, pp. 36-40 (Year: 2011).

\* cited by examiner

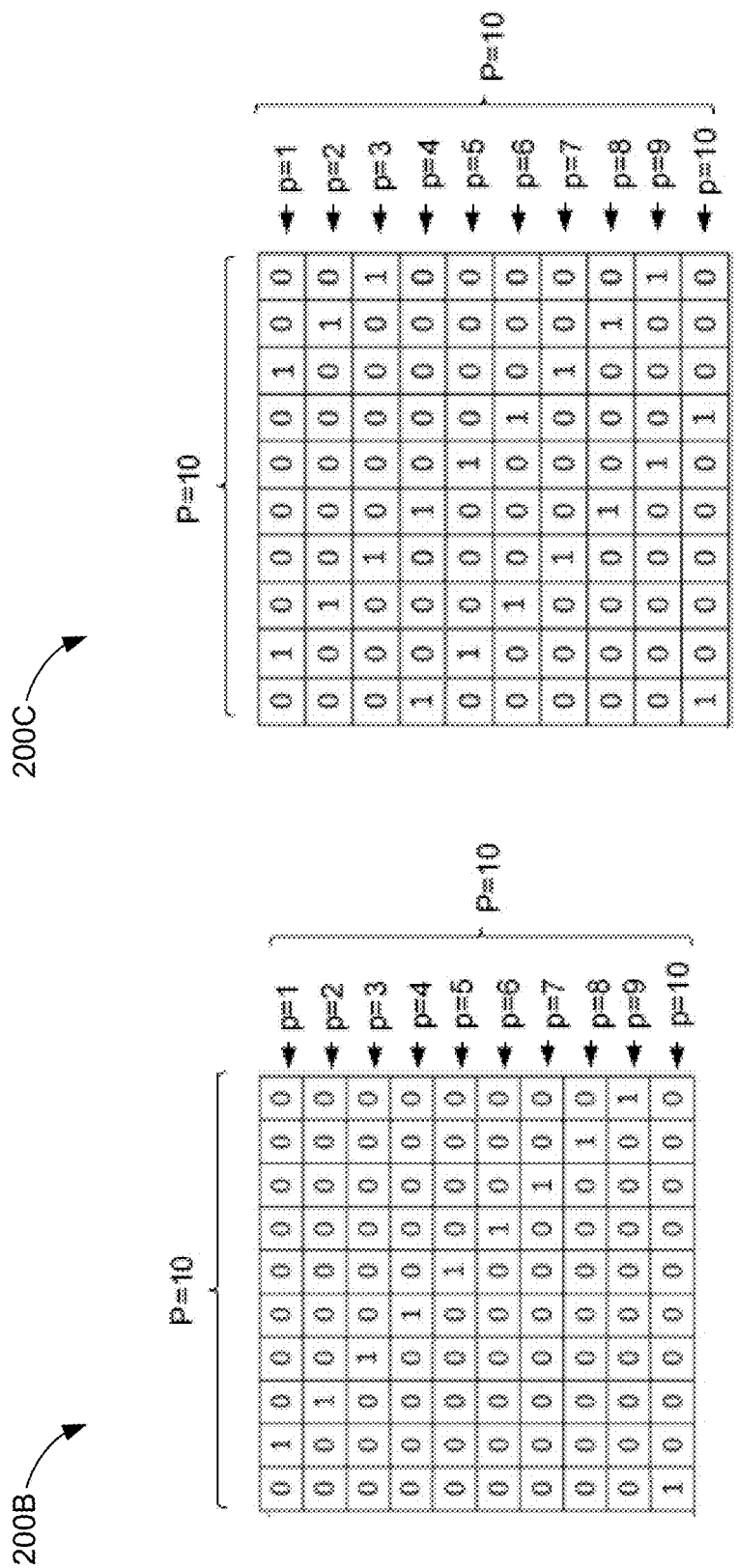

400A

```
1      for b = 1: B
2          for p = 1: P
3              for l = 1: L_b
4                  v_{l,p}^b = v_{l,p}^b - upd\_vnode_{l,p}^b
5              end
6              for l = 1: L_b
7                  upd\_vnode_{l,p}^b = \alpha \min(|V_{l,p}^b|) \prod sign(V_{l,p}^b)
8              end
9              for l = 1: L_b
10                 v_{l,p}^b = v_{l,p}^b + upd\_vnode_{l,p}^b
11             end
12         end
13     end
```

FIG. 4A

```
1   for b = 1:B
2       for p = 1:P
3           for l = 1:L_b
4               if w(vnode_{l,p}^b) == 1
5                   v_{l,p}^b = v_{l,p}^b - layer_upd_vnode_{l,p}^b
6               else
7                   v_{l,p}^b = f(v_{l,p}^b) - layer_upd(f(vnode_{l,p}^b))
8               end
9           for l = 1:L_b
10              row_upd_vnode_{l,p}^b = α min(|V_{l,p}^b|) ∏ sign(V_{l,p}^b)
11          end
12          for l = 1:L_b
13              if w(vnode_{l,p}^b) == 1
14                  layer_upd_vnode_{l,p}^b = row_upd_vnode_{l,p}^b
15                  v_{l,p}^b = v_{l,p}^b + layer_upd_vnode_{l,p}^b
16              else
17                  store row_upd_vnode_{l,p}^b
18              end
19      end
20      for ∀ vnode_b' ∈ Vnode_b'
            layer_upd_vnode_b'
21              = ∑_{vnode_{l,p}^b such that f(vnode_{l,p}^b)=v_b'} row_upd_vnode_{l,p}^b
22          v_b' = v_b' + layer_upd_vnode_b'
23      end
24  end
```

| LDPC Code Register 1110 | | | | | |
|---|---|---|---|---|---|
| Parameter 1112 | Code Index 1114 | | | | |
| | 0 | 1 | 2 | ... | n |
| N | 512 | | | | |
| K | 256 | | | | |
| P | 128 | | | | |
| NLAYERS | 2 | | | | |
| NMQC | 5 | | | | |
| NORM_TYPE | 1 | | | | |
| SC_OFF | 0 | | | | |
| LA_OFF | 1 | | | | |
| QC_OFF | 1 | | | | |

| Shared LA Register 1130 | | | |
|---|---|---|---|
| Index 1132 | Stall 1134 | Accumulate 1136 | CPLD 1138 |
| 0 | | | |
| 1 | x | 0 | 3 |
| | x | 0 | 2 |
| ... | | | |
| y | | | |

FIG. 11

USER-PROGRAMMABLE LDPC DECODER

TECHNICAL FIELD

Aspects of the present disclosure generally relate to integrated circuits, and specifically to low-density parity-check (LDPC) decoders.

BACKGROUND

Low-density parity-check (LDPC) codes are a class of error-correcting codes that may be efficiently encoded and decoded in hardware. LDPC codes are linear codes that have sparse parity-check matrices. The sparseness of the parity-check matrices allows for relatively fast decoding and computationally-inexpensive error correction. Many practical LDPC code designs use quasi-cyclic (QC) LDPC codes to yield more efficient hardware parallelization. Layered decoding is an efficient way of decoding LDPC codes and is commonly used in a wide range of applications. More specifically, layered decoding offers multiple opportunities for parallel implementation. For example, an LDPC decoder implementing layered decoding may be capable of processing multiple rows of a parity-check matrix in a single cycle. However, the number of cycles needed to process an entire layer of a base matrix associated with a QC LDPC code may depend on the hardware resources of the decoder.

Many existing LDPC decoders are preconfigured to support only a limited number of LDPC codes (e.g., for a particular communication standard). However, older LDPC codes are often phased out for newer LDPC codes as new communication standards are developed and existing standards are improved upon. Furthermore, some communication systems may use proprietary LDPC codes (e.g., for a backhaul network). Thus, it may be desirable to implement a programmable LDPC decoder that can be configured (and reconfigured) to support a wide range of LDPC codes.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure are directed to low-density parity-check (LDPC) decoders and methods of their operation. An example decoder circuit may include an LDPC repository, an LDPC code configurator, and LDPC decoding circuitry. The LDPC repository stores parity-check information associated with one or more LDPC codes. The LDPC code configurator may receive a first LDPC configuration describing a parity-check matrix for a first LDPC code and may update the parity-check information in the LDPC repository to reflect the parity-check matrix for the first LDPC code. The LDPC decoding circuitry may receive a first codeword encoded in accordance with the LDPC code. More specifically, the LDPC decoding circuitry may be configured to read the parity-check information associated with the first LDPC code from the LDPC repository and iteratively decode the first codeword using the parity-check information associated with the first LDPC code.

In some embodiments, the first LDPC code may be a quasi-cyclic (QC) LDPC code. For example, the parity-check matrix may be a base matrix comprising a plurality of circulant sub-matrices. In some aspects, at least one of the circulant sub-matrices of the first LDPC code may have a circulant weight greater than 1.

In some embodiments, the LDPC repository may include a code register to store parity-check information describing a length of the first codeword, a number of information bits in the first codeword, a size of the circulant sub-matrices, or a number of layers in the base matrix. In some other embodiments, the LDPC repository may include a circulant register and a layer register. For example, the circulant register may store parity-check information describing the plurality of circulant sub-matrices and the layer register may store parity-check information describing a number of circulant sub-matrices associated with each layer of the base matrix. In some aspects, the parity-check information stored in at least one of the circulant register or the layer register may be shared by a plurality of LDPC codes represented by the LDPC repository.

In some embodiments, the LDPC decoding circuitry may include circulant packing circuitry to update or correct a portion of the first codeword based on multiple circulant sub-matrices of the first LDPC code, concurrently, in a single processing cycle. In some other embodiments, the LDPC decoding circuitry may include circulant reuse circuitry to check a portion of the first codeword against a single circulant sub-matrix of the first LDPC code over multiple processing cycles.

The LDPC code configurator may further receive a second LDPC configuration describing a parity-check matrix for a second LDPC code and the LDPC decoding circuitry may further receive a second codeword encoded in accordance with the second LDPC code. In some embodiments, the LDPC code configurator may update the parity-check information in the LDPC repository to reflect the parity-check matrix for the second LDPC code. Still further, in some embodiments, the LDPC decoding circuitry may read the parity-check information associated with the second LDPC code form the LDPC repository and iteratively decode the second codeword using the parity-check information associated with the second LDPC code.

An example method disclosed herein may be used to operate a decoder circuit. The method may include receiving a first LDPC configuration describing a parity-check matrix for a first LDPC code; updating parity-check information in an LDPC repository to reflect the parity-check matrix for the first LDPC code; receiving a first codeword encoded in accordance with the first LDPC code; reading the parity-check information associated with the first LDPC code from the LDPC repository; and iteratively decoding the first codeword using the parity-check information associated with the first LDPC code.

In some embodiments, the first LDPC code may be a quasi-cyclic (QC) LDPC code. For example, the parity-check matrix may be a base matrix comprising a plurality of circulant sub-matrices. In some aspects, at least one of the circulant sub-matrices of the first LDPC code may have a circulant weight greater than 1.

In some embodiments, the step of updating the parity-check information in the LDPC repository may include a step of storing, in a code register of the LDPC repository, parity-check information describing a length of the first codeword, a number of information bits in the first codeword, a size of the circulant sub-matrices, or a number of layers in the base matrix. In some other embodiments, the step of updating the parity-check information in the LDPC repository may include steps of storing, in a circulant register of the LDPC repository, parity-check information describing the plurality of circulant sub-matrices; and storing, in a layer register of the LDPC repository, parity-check information describing a number of circulant sub-matrices associated with each layer of the base matrix. In some aspects, the parity-check information stored in at least one of the circulant register or the layer register may be shared by a plurality of LDPC codes represented by the LDPC repository.

In some embodiments, the step of decoding the first codeword may include a step of checking a portion of the first codeword against multiple circulant sub-matrices of the first LDPC code, concurrently, in a single processing cycle. In some other embodiments, the step of decoding the first codeword may include a step of checking a portion of the first codeword against a single circulant sub-matrix of the first LDPC code over multiple processing cycles.

In some embodiments, the method may further include receiving a second LDPC configuration describing a parity-check matrix for a second LDPC code; and updating the parity-check information in the LDPC repository to reflect the parity-check matrix for the second LDPC code. Still further, in some embodiments, the method may include receiving a second codeword encoded in accordance with the second LDPC code; reading the parity-check information associated with the second LDPC code form the LDPC repository; and iteratively decoding the second codeword using the parity-check information associated with the second LDPC code.

BRIEF DESCRIPTION OF THE DRAWINGS

The example embodiments are illustrated by way of example and are not intended to be limited by the figures of the accompanying drawings. Like numbers reference like elements throughout the drawings and specification.

FIGS. 2B and 2C show example circulant sub-matrices for an LDPC code, in accordance with some embodiments.

FIG. 4A shows an example layered decoding operation, in accordance with some embodiments.

FIG. 9 shows an example layered decoding operation, in accordance with some other embodiments.

FIG. 11 shows an example configuration of an LDPC repository, in accordance with some other embodiments.

DETAILED DESCRIPTION

Figure 1:
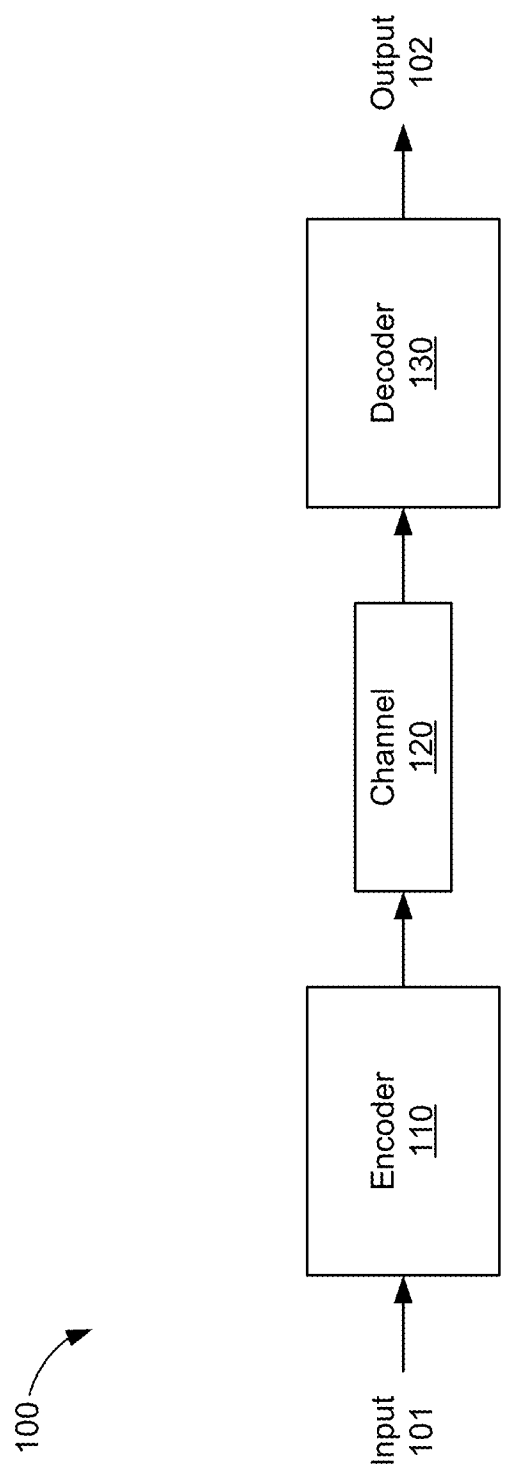
FIG. 1 is a block diagram of an example communication system, in accordance with some embodiments.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

Low-density parity-check (LDPC) codes are widely used in many communication standards. Some LDPC codes may use quasi-cyclic parity-check matrices for improved bit error rate. Such codes may be referred to as quasi-cyclic low-density parity-check (QC LDPC) codes. A parity check matrix for a QC LDPC code may be represented by a base matrix and expansion sub-matrices for expanding the elements of the base matrix. Some LDPC decoders may use a layered approach to decoding QC LDPC codes, for example, by updating soft bit information from layer to layer of the parity-check matrix. Each layer corresponds to a row of the base matrix, which may include a plurality of rows of an expansion sub-matrix. Each sub-matrix of a parity-check matrix may correspond to an all-zero matrix or a circulant matrix having a circulant weight equal to or greater than one. For a circulant matrix with a circulant weight of one, each row and column of the circulant matrix may contain only one non-zero element. Thus, the plurality of rows of the circulant matrix may be processed in parallel (or simultaneously) by an LDPC decoder.

Many existing LDPC decoders are preconfigured to support only a limited number of LDPC codes (e.g., for a particular communication standard). However, older LDPC codes are often phased out for newer LDPC codes as new communication standards are developed and existing standards are improved upon. Aspects of the present disclosure provide a programmable LDPC decoder that can be dynamically configured (and reconfigured) to support a wide range of LDPC codes. In some embodiments, the decoder circuit may include an LDPC repository configured to store parity-check matrices for one or more LDPC codes. More specifically, each parity-check matrix may be stored as a set of parameterized data (e.g., parity-check information) describing various aspects or features of the parity-check matrix (such as codeword length, number of information bits, circulant size, number of layers, and the like). Aspects of the present disclosure recognize that multiple parity-check matrices may have at least some amount of parity-check information in common (such as the rotation of one or more circulant sub-matrices). Thus, in some aspects, at least some of the parity-check information stored in the LDPC repository may be shared or reused by multiple LPDC codes.

In some embodiments, the decoder circuit may include a flexible data path that can support circulant sub-matrices of various sizes. In some aspects, the decoder circuit may be configured to process multiple circulant sub-matrices concurrently (e.g., in a single cycle of the LDPC decoding operation). For example, when the circulant sub-matrices are smaller than a threshold size (e.g., a maximum circulant size that the LDPC decoder can support in a single decoding cycle), the decoder circuit may pack multiple circulants into the LDPC decoder in the same decoding cycle. In some other aspects, the decoder circuit may be configured to process a single circulant sub-matrix across multiple cycles of the LDPC decoding operation. For example, when a circulant sub-matrix is larger than the threshold size, the decoder circuit may provide only a portion of the circulant to the LDPC decoder during each of a plurality of decoding cycles.

Still further, in some embodiments, the decoder circuit may include circuitry for processing circulant sub-matrices with circulant weight greater than 1. For example, sub-matrices with circulant weight greater than 1 introduce additional data dependencies between the rows of the parity-check matrix. However, aspects of the present disclosure may still achieve parallel processing of sub-matrices with circulant weight greater than 1 by treating each circulant as a plurality of overlaid sub-matrices with circulant weight equal to 1. The results from processing each component sub-matrix are then combined (e.g., added) to produce a final result for the corresponding sub-matrix with circulant weight greater than 1. Thus, in some aspects, the decoder circuit may include circuitry for accumulating and combining the results from multiple circulant operations.

FIG. 1 is a block diagram of an example communication system 100, in accordance with some embodiments. The communication system includes an encoder 110, a channel 120, and decoder 130. The encoder 110 and decoder 130 may be provided in respective communication devices such as, for example, computers, switches, routers, hubs, gateways, or other devices capable of transmitting and/or receiving communication signals. The channel 120 may be a wired or wireless communication link between the encoder 110 and the decoder 130.

The encoder 110 may receive an input 101 comprising message data to be transmitted to the decoder 130 via the channel 120. However, imperfections in the channel 120 may introduce channel distortion (e.g., non-linear distortion, multi-path effects, Additive White Gaussian Noise (AWGN), and/or other signal impairments). Thus, the encoder 110 may encode the input 101 prior to transmission. In some embodiments, the encoder 110 may encode the input 101 in accordance with an LDPC code so that error correction may be performed at the decoder 130. For example, the encoder 110 may generate an LDPC codeword as a result of the encoding. The LDPC codeword may be transmitted, over the channel 120, to the decoder 130. Upon receiving the LDPC codeword, the decoder 130 may use a parity-check matrix associated with the LDPC code to decode the received codeword. More specifically, the decoded codeword may be provided as an output 102 to the decoder 130. If channel 120 introduces errors (e.g., flipped bits) into the transmitted codeword, the decoder 130 may detect and correct such errors using the parity-check matrix.

Figure 2A:
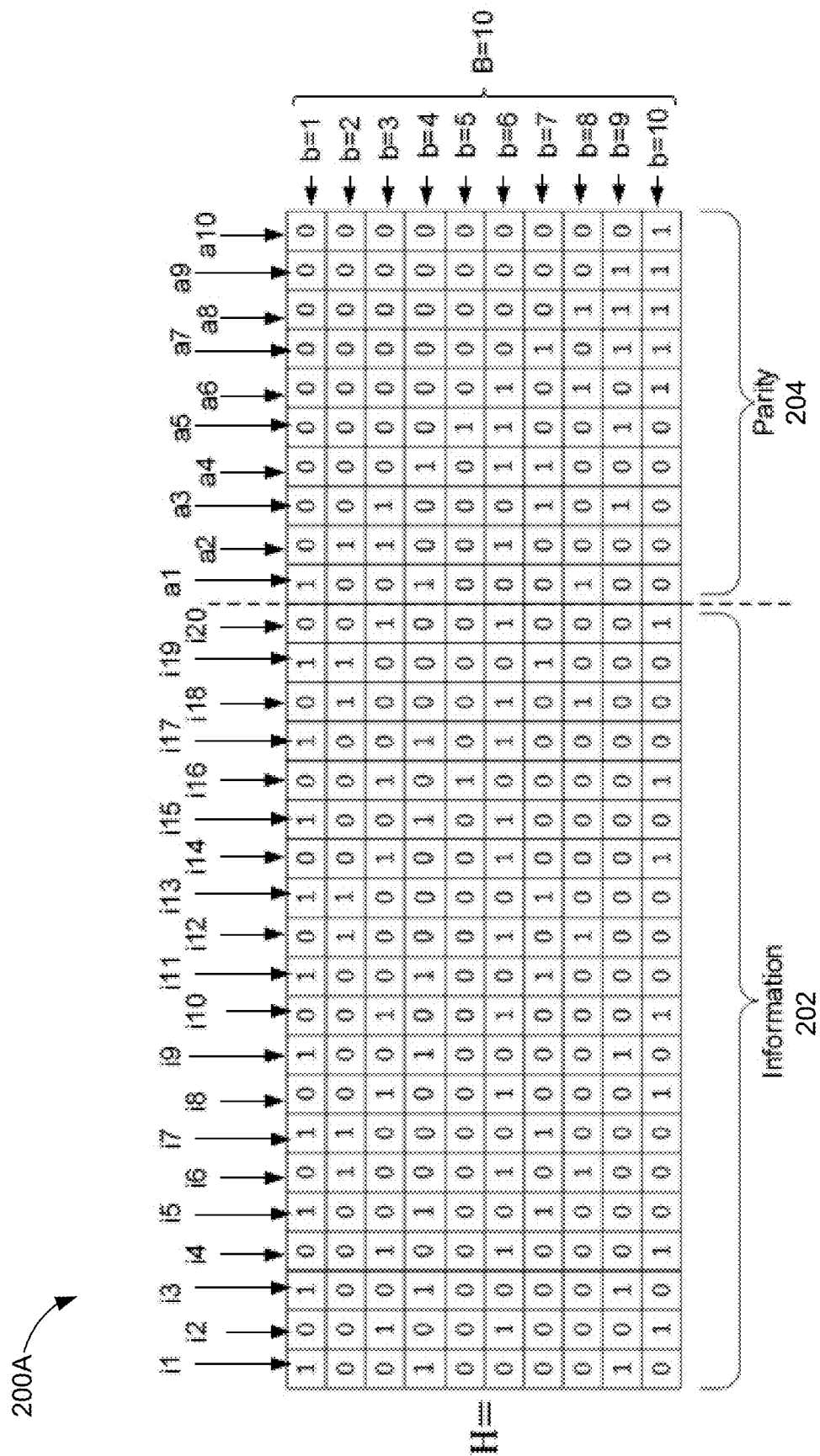
FIG. 2A shows an example parity-check matrix for a low-density parity-check (LDPC) code, in accordance with some embodiments.

FIG. 2A shows an example parity-check matrix 200A for a low-density parity-check (LDPC) code, in accordance with some embodiments. The parity check matrix 200A includes an information part 202 and a parity part 204. The information part 202 of the parity check matrix 200A may correspond to information bits of an LDPC codeword (e.g., information bits i1 through i20 for each row). The parity part 204 of the parity check matrix 200A may correspond to parity bits of the LDPC codeword (e.g., parity bits a1 through a10 for each row). The decoder 130 may determine that a received codeword (c) is a valid codeword if the following condition is satisfied: $Hc^T=0$, where H represents the parity-check matrix 200A.

In some embodiments, the parity-check matrix 200A may correspond to a base matrix of a quasi-cyclic (QC) LDPC code. Each row of the base matrix may be referred to as a "layer," and may be assigned a particular layer index (b) based on the total number (B) of layers in the base matrix. In the example of FIG. 2A, the base matrix 200A is shown to have a total of 10 layers (e.g., B=10). Within a given layer, each column of the base matrix 200A (e.g., i1 through i20) may comprise a sub-matrix. For example, each "0" in the parity-check matrix 200A may be expanded to an all-zero sub-matrix, and each "1" in the parity-check matrix 200A may be expanded to a circulant sub-matrix having a circulant weight equal to or greater than 1. With reference for example to FIG. 2B, a circulant sub-matrix 200B is shown having a circulant weight equal to 1. Thus, each row and column of the circulant sub-matrix 200B contains only one non-zero element. Some QC LDPC codes may include circulant sub-matrices with circulant weight greater than 1. With reference for example to FIG. 2C, a circulant sub-matrix 200 is shown having a circulant weight equal to 2. Thus, each row and column of the circulant sub-matrix 200 contains exactly two non-zero elements.

Figure 3:
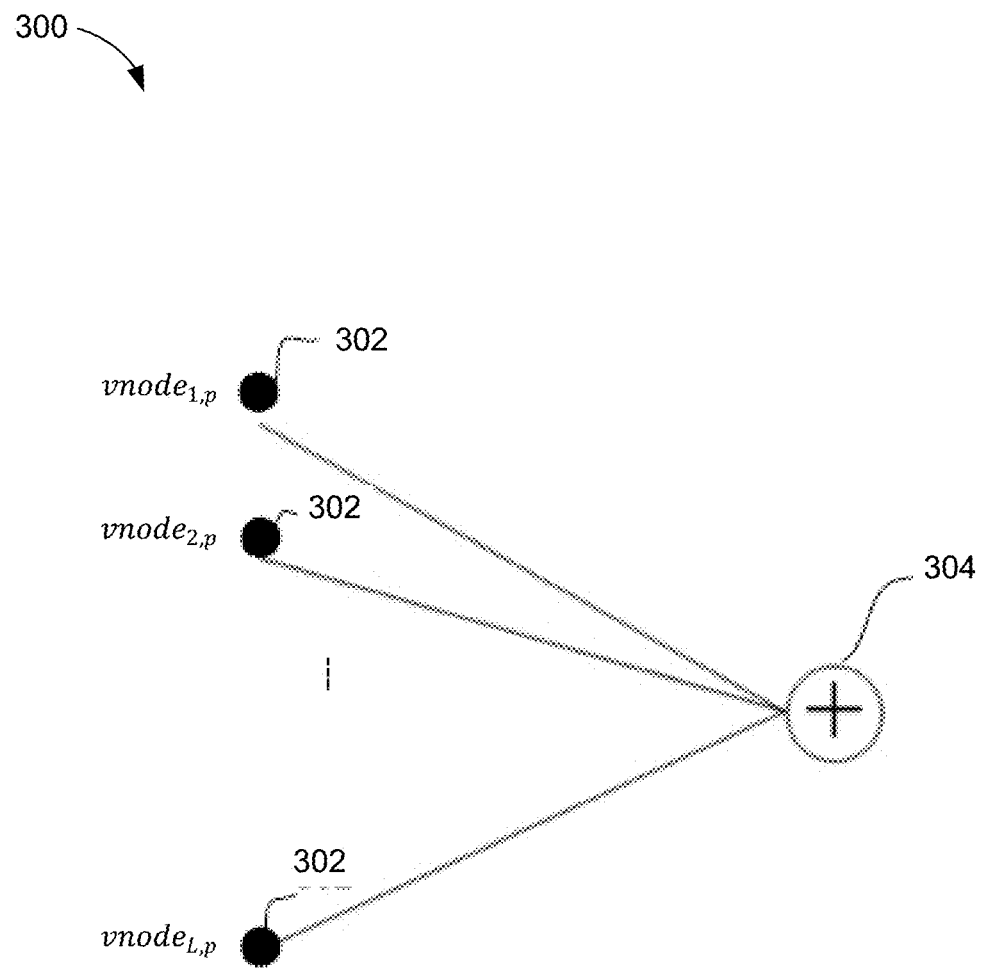
FIG. 3 shows an example bipartite graph representing a row of a parity-check matrix, in accordance with some embodiments.

FIG. 3 shows an example bipartite graph 300 representing a row of a parity-check matrix, in accordance with some embodiments. The bipartite graph 300 (which may also be referred to as a Tanner graph) includes a set of variable nodes 302 ($vnode_{1,p}$ to $vnode_{L,p}$) and a check node 304. The "edges" (e.g., lines) in the bipartite graph 300 connect the variable nodes 302 to the check node 304. More specifically, $vnode_{l,p}$ denotes the $l^{th}$ variable node 302 that participates in the $p^{th}$ row of the parity-check matrix, where L is the total number of non-zero bits in the $p^{th}$ row of the parity-check matrix. With reference for example to FIG. 2A, there are 11 bits (or columns) that participate in the parity-check operation associated with the first row (or layer) of the parity-check matrix 200A, thus L=11 and $vnode_{1,p}$ to $vnode_{L,p}$ are associated with codeword bits i1, i3, i5, i7, 9, i11, i13, i15, i17, i19 and a1, and columns 1, 3, 5, 7, 9, 11, 13, 15, 17, 19, and 20.

An LDPC decoder may decode a received codeword (c) by exchanging messages within the bipartite graph 300, along the edges, and updating these messages by performing computations at the nodes based on the incoming messages. For example, each variable node 302 in the graph 300 may initially be provided with a "soft bit" (e.g., representing the received bit of the codeword) that indicates an estimate of the associated bit's value as determined by observations from the communications channel. Using these soft bits, the LDPC decoder may update messages by iteratively reading them (or some portion thereof) from memory and writing an updated message (or some portion thereof) back to memory. The update operations are typically based on the parity check constraints of the corresponding LDPC code. For example, the LDPC decoder may update the soft bits associated with the codeword c to satisfy the equation: $h_p \cdot c^T = 0$, where $h_p$ is the $p^{th}$ row of the parity-check matrix.

FIG. 4A shows an example layered decoding operation 400A, in accordance with some embodiments. As shown in FIG. 4A, each $b^{th}$ layer of a corresponding parity-check matrix (H) contains the rows $P \cdot (b-1)+1$ to $P \cdot b$, thus each $b^{th}$ layer has a row weight $L_b$. In the layered decoding operation 400A, P denotes the size (e.g., number of rows) of a circulant sub-matrix in the parity-check matrix H, and B denotes the number of layers in the parity-check matrix H (e.g., $B=(N-K)/P$). Furthermore, $v_{l,p}^b$ denotes the log-likelihood ratio (LLR) of the $l^{th}$ variable node vnode$_{l,p}^b$ in the $p^{th}$ row of the $b^{th}$ layer of the parity-check matrix, and $V_{l,p}^b$ denotes the set of LLRs for all of the variable nodes vnode$_{l,p}^b$ that participate in the $p^{th}$ row of the $b^{th}$ layer of the parity-check matrix excluding $v_{l,p}^b$ (e.g., $V_{l,p}^b = V_{l,p}^b \setminus v_{l,p}^b$). The messages exchanged between check nodes and variable nodes are represented as "updates," where upd_vnode$_{l,p}^b$ denotes the update to the variable node vnode$_{l,p}^b$ in the $p^{th}$ row of the $b^{th}$ layer of the parity-check matrix.

In some embodiments, a variable update rule of the layered decoding operation 400A may use a belief propagation algorithm. A belief propagation algorithm may include, for example, a sum-product algorithm, a min-sum algorithm, a scaled min-sum algorithm, a variable scaled min-sum algorithm, and any other suitable belief propagation algorithms. The examples described herein use a scaled min-sum algorithm for illustrative purposes only. In some embodiments, the variable node update rule may perform lines 2 through 12 of the layered decoding operation 400A for each $bt^h$ layer by processing the P consecutive rows of that layer.

Figure 4B:
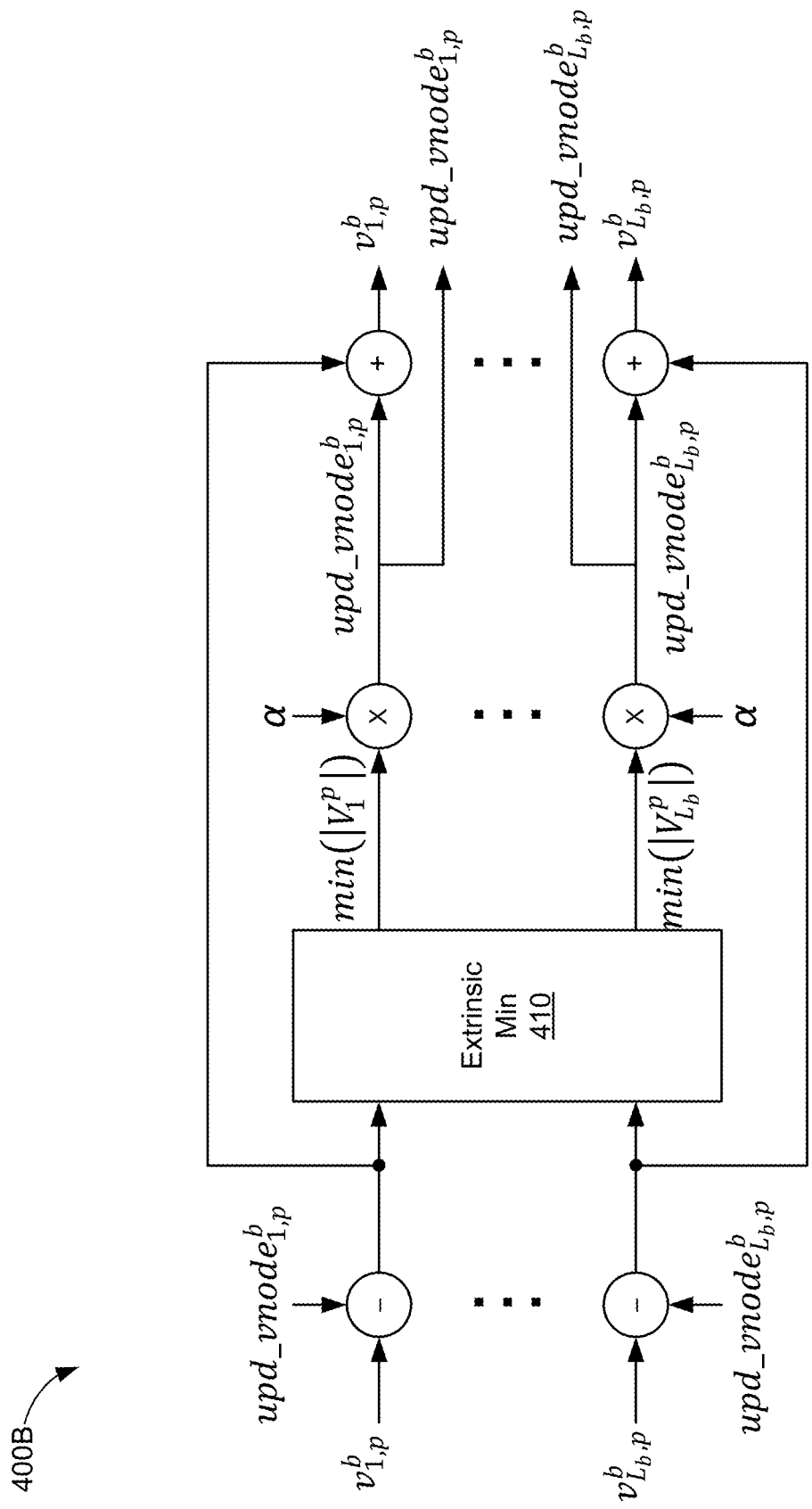
FIG. 4B is a block diagram of an example row processing unit for an LDPC decoder, in accordance with some embodiments.

FIG. 4B is a block diagram of an example row processing unit 400B for an LDPC decoder, in accordance with some embodiments. With reference for example to FIG. 4A, the row processing unit 400B may be configured to process and/or execute lines 3 through 11 of the layered decoding operation 400A for the $p^{th}$ row of the $b^{th}$ layer of a corresponding parity-check matrix. The row processing unit 400B receives, as its inputs, LLR values $v_{1,p}^b$ of through $v_{L_b,p}^b$ (for vnode$_{1,p}^b$ through vnode$_{L_b,p}^b$, respectively). In some aspects, the LLR values $v_{l,p}^b$ of may be obtained from a previous update (e.g., from another layer). Thus, the row processing unit 400B may first subtract the corresponding check node messages upd_vnode$_{1,p}^b$ through upd_vnode$_{L_b,p}^b$ from the LLR values $v_{1,p}^b$ of through $v_{L_b,p}^b$, respectively (e.g., as described in line 4 of the layered decoding operation 400A).

An extrinsic minimum generator 410 may compute the extrinsic minimum values of the LLRs $v_{l,p}^b$ for each variable node index l, from 1 to $L_b$ (e.g., by computing $\min(|V_l^p|) \Pi \operatorname{sign}(V_l^p)$ as described in line 7 of the layered decoding operation 400A). In the example of FIG. 4B, a scalar ($\alpha$) is applied to the extrinsic minimum values $\min(|V_1^p|)$ through $\min(|V_{L_b}^p|)$ to generate scaled extrinsic minimum values, which correspond to updates upd_vnode$_{1,p}^b$ through upd_vnode$_{L_b,p}^b$ for the current layer being processed. The updates upd_vnode$_{1,p}^b$ through upd_vnode$_{L_b,p}^b$ are added to the LLR values $v_{1,p}^b$ of through $v_{L_b,p}^b$, respectively, to produce updated LLR values $v_{l,p}^b$ of (e.g., as described in line 10 of the layered decoding operation 400A) at the output of the row processing unit 400B. The updated LLR values $v_{1,p}^b$ of through $v_{L_b,p}^b$ may then be stored in memory (not shown for simplicity), and may be used in a subsequent update of the layered decoding operation 400A.

It is noted that, the example row processing unit 400B may be scaled to simultaneously process P consecutive rows of a given layer of the parity-check matrix, for example, by operating a number (P) of the row processing units 400B in parallel. For example, a decoder architecture with 128 processors may be able to process one circulant having a size of up to P=128 per cycle. More specifically, it may take the decoder $L_b$ cycles to complete a single layer if P=128. However, if P≤64, the decoder may process multiple circulants (in parallel) in a single cycle of the decoding operation. For example, if 32<P≤64, the decoder may process 2 circulants in parallel per cycle. Further, if 2≤P≤32, the decoder may process 4 circulants in parallel per cycle. Thus, the number of parallel operations that may be performed by the decoder increases as the size of the circulant sub-matrix decreases, allowing a layer to be completed in less than $L_b$ cycles. On the other hand, if P>128, the decoder may process a single circulant over multiple cycles. For example, if 128<P≤256, the decoder may process one circulant in two cycles. Further, if 256<P≤384, the decoder may process one circulant in three cycles.

Aspects of the present disclosure recognize that the LDPC decoding circuitry may be reused to implement a wide range of LDPC codes by changing one or more parameters of the decoding circuitry. For example, an LDPC decoder that is configured for an LDPC code used in Wi-Fi communications (e.g., as defined by the IEEE 802.11 standards) may be dynamically reconfigured for an LDPC code used in 5G communications by changing one or more code definitions executed by the decoding circuitry. In some embodiments, parity-check matrices for one or more LDPC codes may be stored, as a set of parameterized data (e.g., parity-check information), in an LDPC repository. More specifically, the parity-check information may describe various aspects or features of each parity-check matrix (such as codeword length, number of information bits, circulant size, number of layers, and the like). Thus, the LDPC decoder may be configured (or reconfigured) to implement a parity-check matrix associated with a new LDPC code by dynamically updating the parity-check information stored in the LDPC repository.

Figure 5:
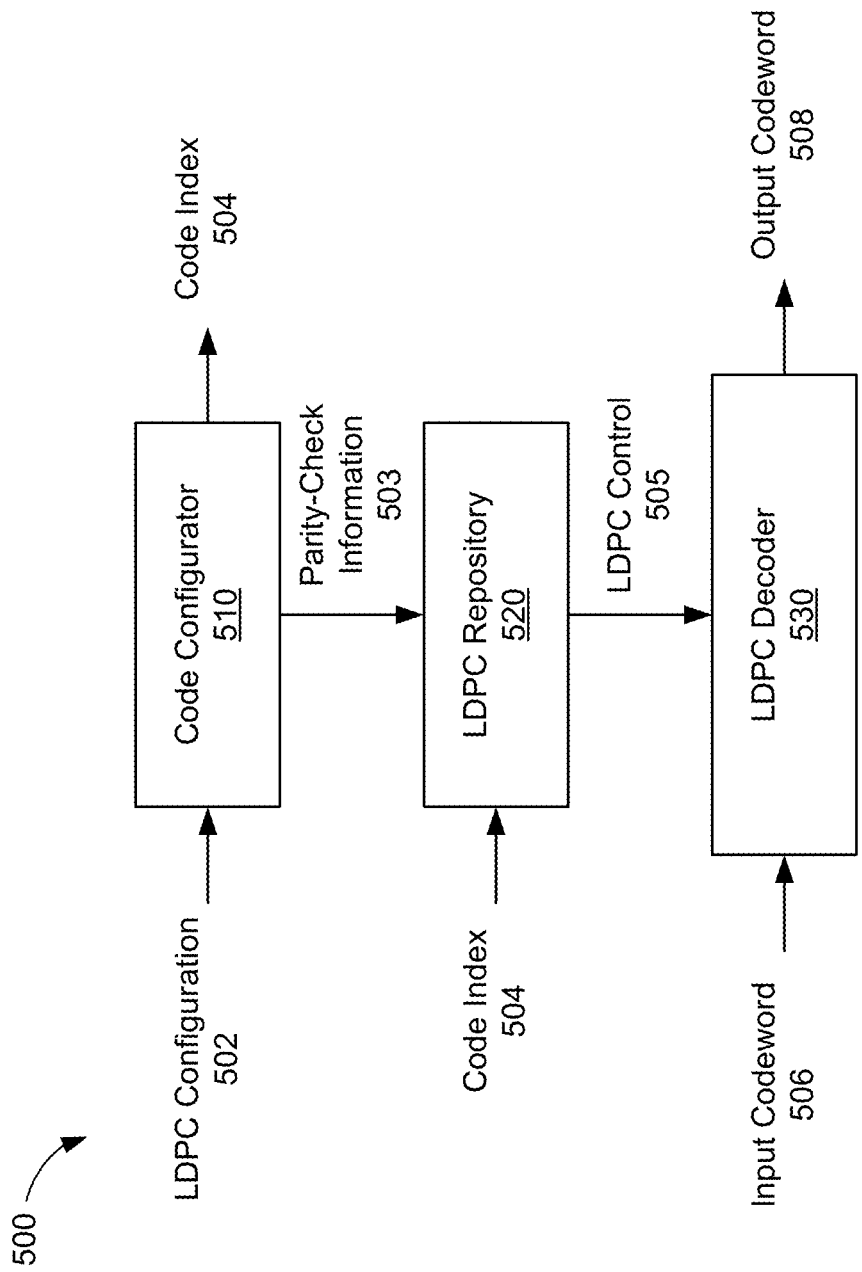
FIG. 5 is a block diagram of a programmable decoder circuit, in accordance with some embodiments.

FIG. 5 is a block diagram of a programmable decoder circuit 500, in accordance with some embodiments. The decoder circuit 500 includes a code configurator 510, an LDPC repository 520, and an LDPC decoder 530. In some embodiments, the decoder circuit 500 may be programmable to support a wide range of LDPC codes (including standardized and custom codes). More specifically, the decoder circuit 500 may be dynamically configured (and reconfigured) to perform LDPC decoding operations in accordance with various LDPC codes by reading and writing parity-check information to and from the LDPC repository 520.

The code configurator 510 may receive an LDPC configuration 502 describing a parity-check matrix for an LDPC code. For example, the LDPC configuration 502 may describe or otherwise indicate the bit values (e.g., "1" or "0") in each column and each row of the associated parity-check matrix, as well as the number of information bits and/or parity bits in each LDPC codeword associated with the parity-check matrix. The code configurator 510 may store the LDPC configuration 502 as a set of parameterized data (e.g., parity-check information 503) in the LDPC repository 520. In some aspects, the parity-check information 503 may provide a high-level description of the associated parity-check matrix (such as codeword length, number of information bits, circulant size, number of layers, and the like). In some embodiments, the code configurator 510 may reuse or update at least some of the existing parity-check information in the LDPC repository 520 when storing the LDPC configuration 502. In some aspects, the code configurator 510 may further generate a code index 504 pointing to the storage location(s), in the LDPC repository 520, of the parity-check information 503 for the received LDPC configuration 502.

The LDPC repository 520 may store parity-check information for one or more LDPC codes. In some embodiments, the parity-check information stored by the LDPC repository 520 may be dynamically updated to reflect different parity-check matrices (e.g., for new LDPC codes). In some embodiments, the LDPC repository 520 may include a plurality of registers that are configured to store different parameters of each LDPC code. For example, aspects of the present disclosure recognize that multiple parity-check matrices may have at least some amount of parity-check information in common (such as the rotation of one or more circulant sub-matrices). Thus, one or more registers of the LDPC repository 520 may be shared or reused by multiple LDPC codes. As described above, the parity-check information associated with different LDPC codes may be indexed by the LDPC repository 530. Thus, when configuring the decoder circuit 500 to implement a particular LDPC code, the LDPC repository 520 may receive an input specifying the code index 504 pointing to the storage location(s) associated with the LDPC code. The LDPC repository 520 may provide a set of LDPC control data 505 to the LDPC decoder 530 based on the received code index 504. In some aspects, the control data 505 may include at least some of the parity-check information 503 associated with the selected LDPC code.

The LDPC decoder 530 may read or receive the LDPC control data 505 from the LDPC repository 520. In some embodiments, the LDPC decoder 530 may implement a parity-check matrix based on the received LDPC control data 505. The LDPC decoder 530 may further receive an input codeword 506 and decode the received codeword 506 using the parity-check matrix associated with the LDPC control data 505. For example, the LDPC decoder 530 may check each bit of the input codeword 506 against the parity-check matrix, update the values for the selected bits based on the parity-check operations, and output the bits (e.g., bits that have either passed or been corrected by the parity-check operations) as an output codeword 508. It is noted that, for proper decoding, the input codeword 506 and the parity-check matrix implemented by the LDPC decoder 530 should correspond to the same LDPC code. Thus, in some embodiments, the LDPC decoder 530 may read or retrieve a particular set of LDPC control data 505 from the LDPC repository 520 based on the received input codeword 506. For example, a different code index 504 may be provided to the LDPC repository 520 for different input codewords 506 (e.g., depending on the LDPC code used to encode the codeword 506).

Figure 6A:
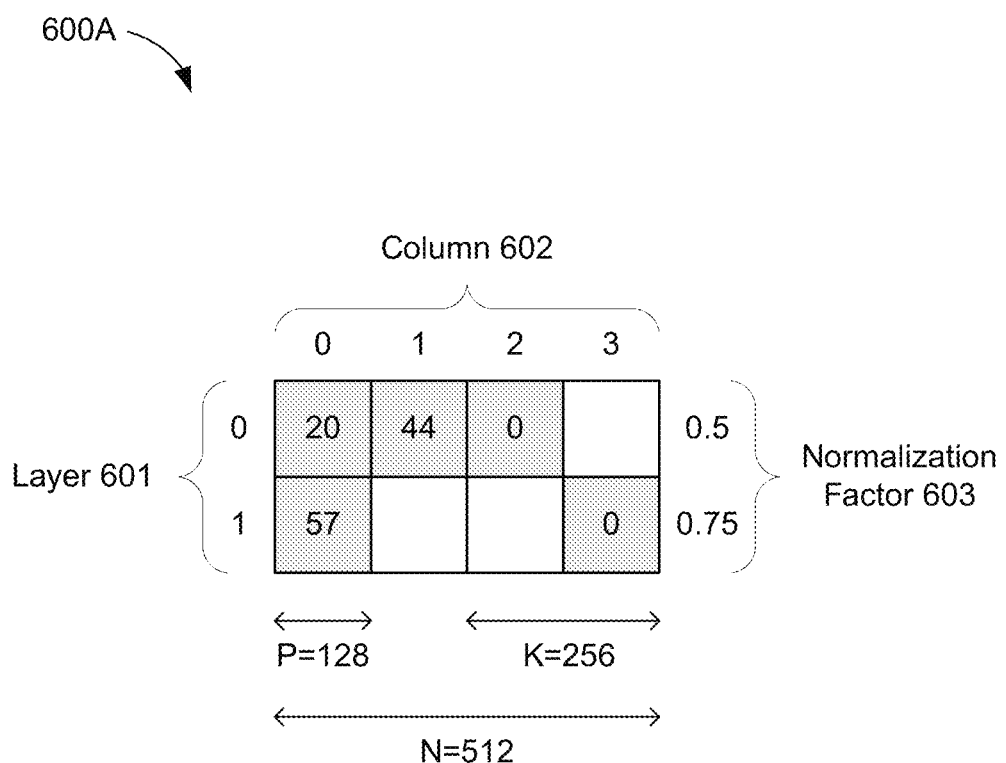
FIG. 6A shows an example LDPC configuration for an LDPC base matrix, in accordance with some embodiments.

FIG. 6A shows an example LDPC configuration for an LDPC base matrix 600A, in accordance with some embodiments. In some embodiments, the base matrix 600A may be associated with a QC LDPC code. The base matrix 600A includes a plurality of layers 601 (e.g., layers 0 and 1) each associated with a particular normalization factor 603 (e.g., 0.5 for layer 0 and 0.75 for layer 1). Each layer of the base matrix 600A is further subdivided into a plurality of columns 602 (e.g., columns 0-3), and each column within a given layer may correspond to an all-zero sub-matrix (depicted as a blank or empty square) or a circulant sub-matrix (depicted as a gray square with a numerical value inside). As described above with respect to FIGS. 2A and 2B, an all-zero sub-matrix may be a P×P matrix in which all of the values are 0 and a circulant sub-matrix may be a P×P matrix in which each row and column contains a number of 1's equal to its circulant weight.

The 1's in a circulant sub-matrix are arranged diagonally across the different layers, wrapping around in a circular fashion (e.g., from the last column to the first column of the sub-matrix). The numerical value inside each gray square indicates the rotation of the particular circulant. As used herein, the term "rotation" describes the initial offset of the diagonal of 1's. For any size rotation (r), the first 1 of the diagonal will reside in the $(r+1)^{th}$ column of the first row of the circulant. For example, when the rotation is equal to 0, the first 1 of the diagonal will reside in the first column of the first row of the circulant. On the other hand, when the rotation is equal 1, the first 1 of the diagonal will reside in the second column of the first row of that circulant (e.g., as shown in FIG. 2B). With reference for example to FIG. 2C, the circulant sub-matrix 2000 can be described by two rotations, including a first rotation equal to 1 (e.g., the first 1 of the first diagonal resides in the second column of the first row of the circulant) and a second rotation equal to 7 (e.g., the first 1 of the second diagonal resides in the eighth column of the first row of the circulant).

In the example of FIG. 6A, the first layer (e.g., layer 0) of the base matrix 600A has three circulant sub-matrices, including a first circulant having a rotation of size 20 (e.g., in column 0), a second circulant having a rotation of size 44 (e.g., in column 1), and a third circulant having a rotation of size 0 (e.g., in column 2). The second layer (e.g., layer 1) of the base matrix 600A has two circulant sub-matrices, including a first circulant having a rotation of size 57 (e.g., in column 0) and a second circulant having a rotation of size 0 (e.g., in column 3). Each circulant sub-matrix comprises 128 rows and 128 columns (e.g., P=128). The base matrix 600A may be used to decode 512-bit LDPC codewords (e.g., N=512) in which only 256 bits are information bits (e.g., K=256). Thus, the remaining 256 bits of each LDPC codeword are parity bits.

Figure 6B:
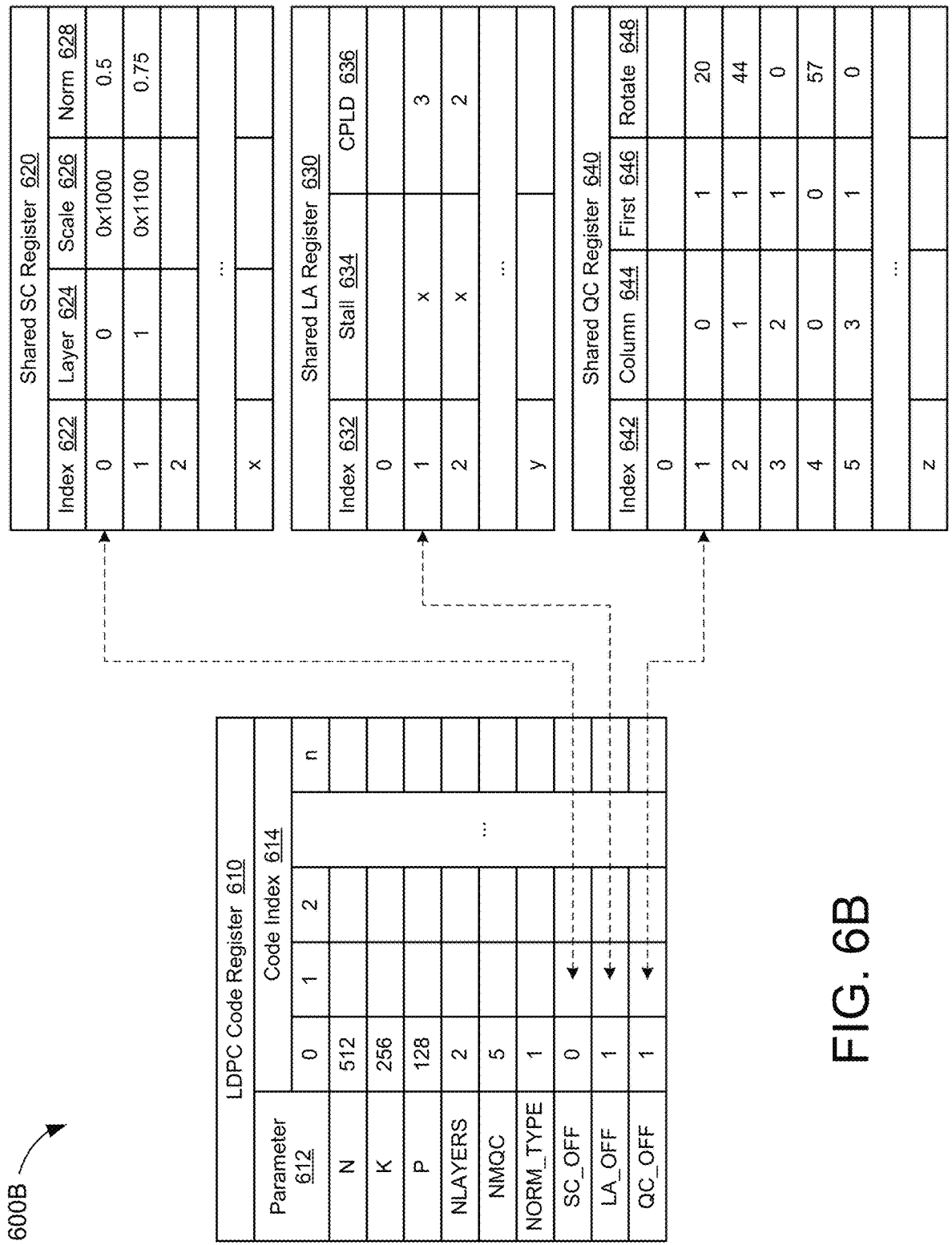
FIG. 6B shows an example configuration of an LDPC repository, in accordance with some embodiments.

FIG. 6B shows an example configuration of an LDPC repository 600B, in accordance with some embodiments. The LDPC repository 600B may represent an example configuration of the LDPC repository 520 of FIG. 5. In some embodiments, the LDPC repository 600B may be configured to store parity-check information describing parity-check matrices for one or more LDPC codes. In some aspects, at least some of the parity-check information stored in the LDPC repository 600B may be specific or unique to a particular LDPC code. In some other aspects, at least some of the parity-check information stored in the LDPC repository 600B may be common or shared among multiple LDPC codes. In the example of FIG. 6B, the LDPC repository 600B includes an LDPC code register 610, a shared scaling factor (SC) register 620, a shared layer (LA) register 630, and a shared circulant (QC) register 640.

The LDPC code register 610 may be configured to store code-specific parameters for one or more LDPC codes. Each row of the LDPC code register 610 may be associated with a different parameter 612 of the LDPC code. Example parameters 612 include, but are not limited to, the number of codeword bits (N), the number of information bits (K), the size of each sub-matrix (P), the number of layers in the base matrix (NLAYERS), the total number of circulant operations in the base matrix (NMQC), and whether normalization is to be applied (NORM_TYPE). In some implementations, N and K may be captured as multiples ($N_b$ and $K_b$, respectively) of P (e.g., where $N=P*N_b$ and $K=P*K_b$). Thus, P may be provided as an input along with the codeword data. As described in greater detail below, the parameters 612 may also include pointers to one or more shared registers. For example, the LDPC code register 610 may store a pointer to the shared SC register 620 (SC_OFF), a pointer to the shared LA register 630 (LA_OFF), and/or a pointer to the shared QC register 630 (QC_OFF). Each column of the LDPC code register 610 may be associated with a different code index 614. For example, the code-specific parameters for a particular LDPC code may be stored in the appropriate rows for the given index (e.g., 0-n). In the example of FIG. 6B, the rows associated with index 0 of the LDPC code register 610 are populated with parity-check information describing the base matrix 600A of FIG. 6A.

The shared SC register 620 may be configured to store the normalization factor to be applied to the processing of each layer of the base matrix. Data in the shared SC register 620 may be organized in a plurality of columns 622-628. The first column stores an SC index 622 for a corresponding set of scaling factors. The second column stores layer information 624 indicating the layer of the base matrix associated with a particular scaling factor. The third column stores scaling information 626 indicating a scale value (e.g., 0-15) to be used for generating each scaling factor. The fourth column stores normalization information 628 indicating the scaling factor ($\alpha$) to be applied to each layer of the base matrix (e.g., $\alpha=1$ when scale value is 0, and $\alpha=0.0625*$ [scale value] when scale value is any number between 1-15). In some embodiments, the parity-check information stored by the SC register 620 may be shared or reused by multiple LDPC codes. For example, two or more LDPC codes stored in the LDPC code register 610 may use the same scaling factors, and may thus point to the same SC index 622 in the shared SC register 620.

The shared LA register 630 may be configured to store layer information describing the number of operations to be performed on each layer of the base matrix. Data in the shared LA register 630 may be organized in a plurality of columns 632-636. The first column stores an LA index 632 for a corresponding set of layer information. The second column stores a stall value 634 indicating the number of cycles (e.g., 0-255) to wait at the start of a layer to enforce data dependencies. For example, data dependencies often exist between layers and/or iterations of an LDPC decoding operation. To enforce such data dependencies, it may be desirable to ensure that at least a threshold amount of time has elapsed (e.g., corresponding to the stall value) between successive memory accesses to the same data. The third column of the LA register 630 stores a CPLD value 636 indicating the number of processing cycles per layer. It is noted that the number of circulant operations that can be performed in each of the cycles may depend on the packing factor (e.g., as described in greater detail below). In some embodiments, the parity-check information stored by the LA register 630 may be shared or reused by multiple LDPC codes. For example, two or more LDPC codes stored in the LDPC code register 610 may use the same layer information, and may thus point to the same LA index 632 in the shared LA register 630.

The shared QC register 640 may be configured to store circulant information describing one or more circulant sub-matrices included in the base matrix. Data in the shared QC register 640 may be organized in a plurality of columns 642-648. The first column stores a QC index 642 for a corresponding set of circulants. The second column 644 stores column information 644 indicating the column of the base matrix in which a particular circulant can be found. The third column stores a first-use value 646 indicating whether the corresponding column of the base matrix is being used or accessed for the first time in the decoding operation. The fourth column stores rotation information 648 indicating the size of the rotation of the corresponding circulant sub-matrix. In some embodiments, the parity-check information stored by the QC register 640 may be shared or reused by multiple LDPC codes. For example, two or more LDPC codes stored in the LDPC code register 610 may use the same circulant information, and may thus point to the same QC index 642 in the shared QC register 640.

It is noted that the configuration shown in FIG. 6B provides significant flexibility in the way LDPC codes are stored and/or accessed in the LDPC register 600B. For example, the parity-check information stored in one or more of the shared registers 620-640 may be reused to support different code rates and/or codeword sizes. In some aspects, the size of the sub-matrix (e.g., in the LPDC code register 610) may be modified to support different codeword sizes at the same code rate. For example, the N, K, and/or P parameters associated with a particular code index may be changed while maintaining the same pointer values SC_OFF, LA_OFF, and QC_OFF. In some other aspects, a portion of the base matrix may be reused to support different codeword sizes and rates for the same number of information bits (K). For example, it may be possible to reduce the number of columns in a particular base matrix by reducing the number of layer (NLAYERS) and the codeword length (N) while maintaining the same pointer values SC_OFF, LA_OFF, and QC_OFF. This may result in an increase in code rate as the number of parity bits and codeword size is reduced. Still further, in some aspects, a portion of the base matrix may be reused to support different code rates for the same codeword size. For example, it may be possible to reduce the number of layers (NLAYERS) to increase the number of information bits (K) at a constant codeword length (N) by adjusting the pointer values SC_OFF, LA_OFF, and QC_OFF (and adjusting NLAYERS and K).

Figure 7:
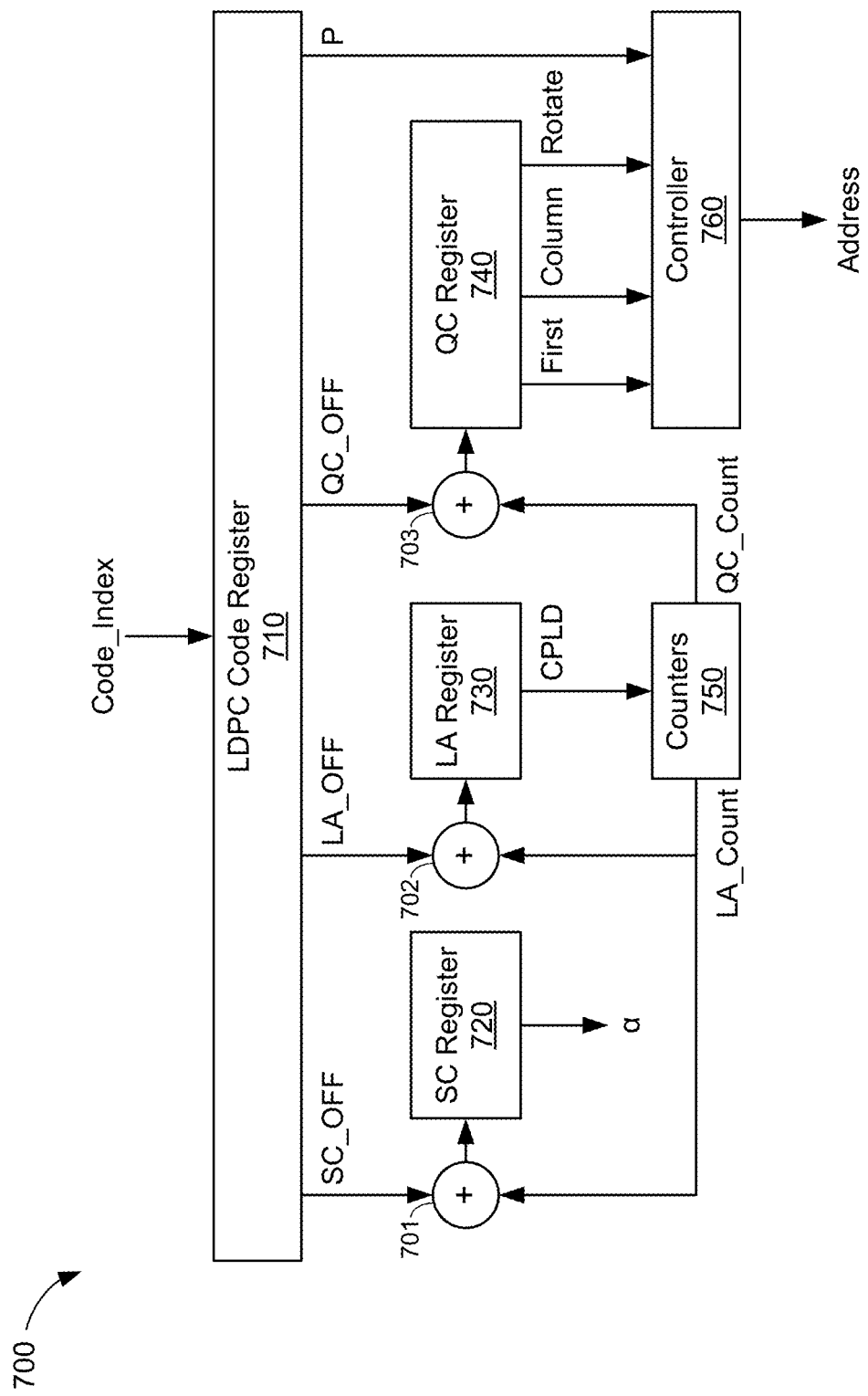
FIG. 7 is a block diagram of an example LDPC repository, in accordance with some embodiments.

FIG. 7 is a block diagram of an example LDPC repository 700, in accordance with some embodiments. The LDPC repository 700 may be an example embodiment of the LDPC repository 520 of FIG. 5. In some embodiments, the LDPC repository 700 may be configured to store parity-check information describing parity-check matrices for one or more LDPC codes. More specifically, the LDPC repository 700 may generate a set of LDPC control data, to control a decoding operation of a programmable LDPC decoder, for a selected LDPC code. The LDPC control data may enable the programmable LDPC decoder to decode an LDPC codeword using a parity-check matrix associated with the LDPC code used to encode the LDPC codeword.

The LDPC repository 700 includes an LDPC code register 710, an SC register 720, an LA register 730, and a QC register 740. In some embodiments, the LDPC code register 710 may be configured according to the LDPC code register 610 of FIG. 6B. Thus, the LDPC code register 710 may be configured to store code-specific parameters for one or more LDPC codes (e.g., N, K, P, NLAYERS, NMQC, and NORM_TYPE) and pointers to one or more shared registers (e.g., SC_OFF, LA_OFF, and QC_OFF). In some embodiments, the SC register 720 may be configured according to the shared SC register 620 of FIG. 6B. Thus, the SC register 720 may be configured to store the normalization factor ($\alpha$) to be applied to the processing of each layer of the base matrix. In some embodiments, the LA register 730 may be configured according to the shared LA register 630 of FIG.

6B. Thus, the LA register 730 may be configured to store layer information (e.g., CPLD) describing the number of processing cycles to be performed on each layer of the base matrix. In some embodiments, the QC register 740 may be configured according to the shared QC register 640 of FIG. 6B. Thus, the QC register 740 may be configured to store circulant information (e.g., First, Column, Rotate) describing one or more circulant sub-matrices included in the base matrix.

In some embodiments, the LDPC repository 700 may include additional circuitry for retrieving or reading the LDPC control data from the registers 710-740. For example, the additional circuitry may include a set of counters 750, a controller 760, and a plurality of adders 701-703. The adders 701-703 may be coupled to the registers 720-740, respectively, to retrieve shared parity-check information associated with a selected LDPC code. For example, the LDPC code register 710 may receive a code index (Code_Index) identifying a particular parity-check matrix stored in the LDPC repository 700. The LDPC code register 710 may output a set of parameters associated with the corresponding code index. For example, the parameters may include the sub-matrix size (P) and pointers to respective registers 720-740 (SC_OFF, LA_OFF, and QC_OFF).

The counters 750 may generate a layer count value (LA_Count) and a circulant count value (QC_Count) based, at least in part, on the number of processing cycles to be performed on each layer of the base matrix (CPLD). More specifically, LA_Count may be used to increment the pointers to the SC register 720 and LA register 730 by adding the LA_Count value to SC_OFF and LA_OFF, respectively, via the adders 701 and 702. Moreover, QC_Count may be used to increment the pointer to the QC register 740 by adding the QC_Count value to QC_OFF via the adder 703. In some embodiments, the counters 750 may be initialized to a count value of zero (e.g., LA_Count=0 and QC_Count=0). The counters 750 may increment LA_Count to retrieve, from the SC register 720, the scaling factor (a) associated with each layer of the base matrix and to retrieve, from the LA register 730, the number of processing cycles to be performed (CPLD) on each layer of the base matrix. the counters 750 may further increment QC_Count to retrieve, from the QC register 740, the circulant information (First, Column, and Rotate) for each layer of the base matrix. In some aspects, the counter 750 may determine when to increment LA_Count based on the current QC_Count value and the CPLD information output by the LA register 730. For example, the counter 750 may increment LA_Count once the QC_Count value is equal to the total number of count values for the current layer (e.g., as indicated by CPLD).

The controller 760 may generate a memory address (Address) based, at least in part, on the circulant information output by the QC register 740 and one or more LDPC code parameters output by the LDPC code register 710. For example, the controller 760 may determine the location in memory at which a selected portion of the LDPC codeword is stored. The selected portion may coincide with the column(s) of the LDPC codeword to participate in the current processing cycle of the LDPC decoding operation. In some embodiments, the controller 760 may determine the memory address of the selected portion of the LDPC codeword based, at least in part, on the sub-matrix size (P) and the column of the base matrix in which a corresponding circulant is located (Column). In some aspects, the controller 760 may retrieve additional information (not shown for simplicity) from the LDPC code register 710 for determining the memory address. Such additional information may include, for example, a parameter indicating the number of M-size vectors in the codeword (N) accounting for sub-matrix size (P) and packing.

Figure 8:
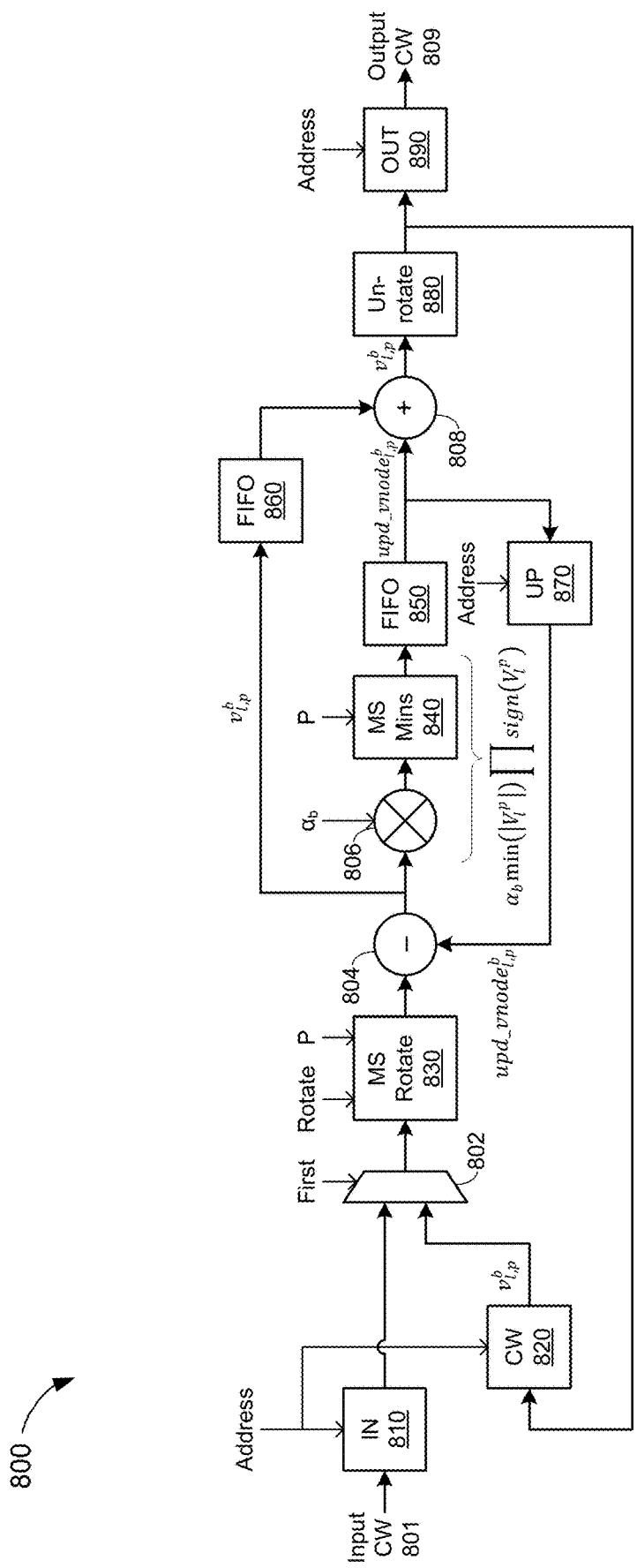
FIG. 8 is a block diagram of a programmable LDPC decoder, in accordance with some embodiments.

FIG. 8 is a block diagram of a programmable LDPC decoder 800, in accordance with some embodiments. The programmable LDPC decoder 800 may be an example embodiment of the LDPC decoder 530 of FIG. 5. In some embodiments, the LDPC decoder 800 may be dynamically configured (and reconfigured) to perform LDPC decoding operations in accordance with one or more LDPC codes stored in an LDPC repository (such as the LDPC repository 700 of FIG. 7). For example, the LDPC decoder 800 may implement a parity-check matrix associated with a selected LDPC code based on LDPC control data provided by the LDPC repository. In some embodiments, the LDPC decoder 800 may be configured to process multiple circulants of the parity-check matrix in parallel. For example, the LDPC decoder 800 may pack multiple circulant operations into a single processing cycle (e.g., clock cycle).

The LDPC decoder 800 includes an input (IN) buffer 810, a codeword (CW) buffer 820, a multi-size (MS) rotator 830, an MS minimum generator 840, first-in first-out (FIFO) buffers 850 and 860, an update (UP) buffer 870, an un-rotator 880, and an output (OUT) buffer 890. In some embodiments, the buffers 810, 820, 870, and 890 may correspond to random access memory (RAM). However, in actual implementations, any type of data storage device may be used to implement the buffers 810, 820, 870, and 890. In some implementations, the buffers 810, 820, 870, and/or 890 may be combined in various ways. For example, in some aspects, the input buffer 810, CW buffer 820, and/or output buffer 890 may be combined to reduce the amount of time spent reading and writing input and output data between the buffers.

The input buffer 810 may receive and store an input codeword (CW) 801 to be decoded. In some embodiments, each bit of the input codeword 801 may be represented by a log-likelihood ratio (LLR):

$$LLR(x) = \ln\left(\frac{Pr(x=1)}{Pr(x=0)}\right)$$

where Pr(x=1) is the probability that a particular bit (x) of the input codeword 801 is 1 and Pr(x=0) is the probability that the particular bit (x) of the input codeword 801 is 0. Thus, negative LLR values may be interpreted as a hard binary "0" value and positive LLR values (and LLR=0) may be interpreted as a hard binary "1" value. It is noted that, in other implementations, negative LLR values may be interpreted as a hard binary "1" value and positive LLR values (and LLR=0) may be interpreted as a hard binary "0" value.

In some embodiments, one or more of the buffers 810, 820, and/or 890 may be partitioned into a number (NMB) of memory banks to enable parallel decoding operations to be performed on LLRs associated with multiple columns of the input codeword 801. For example, the width of the input buffer 810 may be equal to a number (M) of LLRs. Thus, each individual memory bank may have a width equal to m, where m=M/NMB. In some aspects, the LLRs of the input codeword 801 may be stored across the plurality of memory banks in a round-robin fashion. During each processing cycle of the LDPC decoding operation, each memory bank may output up to m LLRs (e.g., for a maximum of M LLRs that can be output in parallel by the input buffer 810). For example, if the input buffer 810 is partitioned into 4 memory banks (NMB=4) with a combined width equal to 128 LLRs (M=128), the input buffer 810 may be configured to output either 1 column (e.g., P=128), 2 columns (e.g., P=64), or 4 columns (e.g., P=32) of the input codeword in parallel. Accordingly, the partitioning of the input buffer 810 (e.g., into a plurality of memory banks) may facilitate the processing of multiple circulants of the parity-check matrix in parallel (e.g., in a single processing cycle).

At runtime, the input buffer 810 may receive LDPC control data (e.g., Address) from the LDPC repository indicating the memory addresses of selected LLRs that participate in the current layer of decoding. The selected LLRs may be provided as inputs to a multiplexer 802 which selectively outputs the LLRs from the input buffer 810 (or a set of LLRs from the codeword buffer 820) to the MS rotator 830 based on LDPC control data (e.g., First) received from the LDPC repository. In some embodiments, the multiplexer 802 may output the LLRs from the input buffer 810 only if the LLRs are being used for the first time in the decoding operation (e.g., First=1). For any subsequent circulant operations performed on the same set of the LLRs within the same layer (e.g., First=0), the multiplexer 802 may output updated LLR values from the CW buffer 820 instead. In some other embodiments, the multiplexer 802 may output the LLRs from the input buffer 810 for each of the circulant operations (e.g., when the CW buffer 820 is combined or integrated with the input buffer 810).

The MS rotator 830 receives the LLRs from the multiplexer 802 and rotates the received LLRs based on LDPC control data (e.g., Rotate and P) received from the LDPC repository. For example, the MS rotator 830 may shift or rotate the LLRs stored in memory to coincide with the rotation(s) of the circulant sub-matrices to be applied in the current processing cycle (e.g., so that the circulant operations can be performed on the LLRs in the correct order). The MS rotator 830 may determine the size of the rotation(s) to be applied to the LLRs based at least in part on the rotation (e.g., Rotate) and sub-matrix size (e.g., P) of the circulants. In some embodiments, the MS rotator 830 may be configured to perform multiple rotations, concurrently, on the received LLRs based on the number of circulants that are packed into the current processing cycle. For example, when the LDPC decoder 800 is configured to perform 2 circulant operations in parallel (e.g., where at least some of the hardware of the LDPC decoder 800 is reused), the MS rotator 830 may perform 2 concurrent rotations (e.g., performing a different rotation on each subset of LLRs) on the LLRs received from the multiplexer 802. Similarly, when the LDPC decoder 800 is configured to perform 4 circulant operations in parallel, the MS rotator 830 may perform 4 concurrent rotations on the LLRs received form the multiplexer 802. Accordingly, the MS rotator 830 may further facilitate the processing of multiple circulants of the parity-check matrix in parallel (e.g., in a single processing cycle).

The rotated LLRs may be combined, by a subtractor circuit 804, with update messages (e.g., upd_vnode$_{l,p}^{b}$) from the update buffer 870. It is noted that each of the update messages upd_vnode$_{l,p}^{b}$, may correspond to respective updates upd_vnode$_{l,p}^{b}$, of FIGS. 4A and 4B. More specifically, the subtractor circuit 804 may subtract the update messages upd_vnode$_{l,p}^{b}$ from the LLRs $v_{l,p}^{b}$ (e.g., as described in line 4 of the layered decoding operation 400A of FIG. 4A). In some aspects, the resulting LLRs $v_{l,p}^{b}$ of may be buffered by the FIFO 860. In some other aspects, the MS minimum generator 840 may compute the extrinsic minimum values of the LLRs $v_{l,p}^{b}$ of (e.g., by computing min($|V_i^p|$)Π sign($V_i^p$) as described in line 7 of the layered decoding operation 400A of FIG. 4A). In some embodiments, the MS minimum generator 840 may be configured to compute multiple extrinsic minimum values, concurrently, for different sets of LLRs based on the number of circulants that are packed into the current processing cycle. Accordingly, the MS minimum generator 840 may further facilitate the processing of multiple circulants of the parity-check matrix in parallel (e.g., in a single processing cycle). In some aspects, a multiplier 806 may apply a scaling factor ($\alpha_b$) to the extrinsic minimum values min($|V_i^p|$) to generate scaled extrinsic minimum values, which correspond to update messages upd_vnode$_{l,p}^{b}$ for the current layer being processed.

The update messages upd_vnode$_{l,p}^{b}$ output by the MS minimum generator 840 may be buffered by the FIFO 850. In some embodiments, the FIFO 850 may be configured to store (for each layer) sign($V_i^p$), the Π sign($V_i^p$), and the two lowest "minima" calculated for min($|V_i^p|$). For example, the first minimum may correspond to the lowest magnitude calculated across all $V_i^p$ and the second minimum may correspond to the second-lowest magnitude calculated across all $V_i^p$. Aspects of the present disclosure recognize that the magnitude of upd_vnode$_{l,p}^{b}$ may correspond to the first minimum or the second minimum, depending on whether the value $V_i^p$ excluded from the min-sum calculation corresponds to the first minimum. Thus, in some embodiments, upd_vnode$_{l,p}^{b}$, may be reconstructed at the output of the FIFO 850 based on the values stored for each layer. For example, the sign of upd_vnode$_{l,p}^{b}$, may be determined based on the product of sign($V_i^p$) and Πsign($V_i^p$), and the magnitude of upd_vnode$_{l,p}^{b}$, may correspond to the first minimum or the second minimum stored therein (e.g., depending on the value $V_i^p$ excluded from the min-sum calculation).

In some aspects, the FIFO 850 may output the update messages upd_vnode$_{l,p}^{b}$ to the update buffer 870, where the update messages upd_vnode$_{l,p}^{b}$, pare subsequently stored (e.g., for use in the next layer of the decoding operation). In some other aspects, the update messages upd_vnode$_{l,p}^{b}$, may be combined, by an adder circuit 808, with the LLRs $v_{l,p}^{b}$ from the FIFO 860, and the updated LLRs $v_{l,p}^{b}$ may be rotated by the un-rotator 880. More specifically, the adder circuit 808 may add the update messages upd_vnode$_{l,p}^{b}$ to the LLRs $v_{l,p}^{b}$ (e.g., as described in line 10 of the layered decoding operation 400A of FIG. 4A). The un-rotator 880 may undo the rotation applied by the MS rotator 830 so that the resulting LLRs $v_{l,p}^{b}$ can be returned to memory in their original positions. In some implementations, the un-rotator 880 may be bypassed or excluded from the LDPC decoder 800. In some aspects, the resulting LLRs $v_{l,p}^{b}$ may be stored in the codeword buffer 820 (e.g., for use in the next layer of the decoding operation). In some other aspects, the resulting LLRs $v_{l,p}^{b}$ may be stored in the output buffer 890 to be combined into an output codeword 809. In some embodiments, the output buffer 890 may receive LDPC control data (e.g., Address) from the LDPC repository indicating the memory addresses of selected LLRs stored in the output buffer 890. The selected LLRs may be output from the output buffer 890 as the output codeword 809.

It is noted that, in some embodiments, one or more circulants of a base matrix may have a circulant weight greater than 1 (e.g., as shown in FIG. 2C). In such embodiments, data dependencies may exist between the update messages in a particular layer. As such, the layered decoding operation described above (e.g., with reference to FIG. 4A) may not be implemented by processing the P rows of a particular layer in parallel. However, aspects of the present disclosure recognize that, by computing row updates for each row and storing the row updates in a storage element, a layer update operation may be performed using the stored row updates for sub-matrices having circulant weights greater than 1 in the P rows. This allows the row updates to be performed in parallel. More specifically, the P rows of the same layer may be processed in parallel despite the data dependencies between the P rows.

FIG. 9 shows an example layered decoding operation 900, in accordance with some other embodiments. In the layered decoding operation 900, $w(vnode_{l,p}^{b})$ denotes the circulant weight of the variable node $vnode_{l,p}^{b}$ in the corresponding circulant sub-matrix for a given layer b. It is noted that, for $w(vnode_{l,p}^{b})>1$, the same variable node will be updated at least twice within the same layer. Furthermore, $vnode_{b}' \in Vnode_{b}'$ denotes variable nodes with circulant weight greater than 1 within the $b^{th}$ layer of the parity check matrix. In some embodiments, the layered decoding process 900 may keep track of only the accumulated updates to variable nodes with circulant weight greater than 1 in the $b^{th}$ layer. As such, $f(vnode_{l,p}^{b}) \rightarrow v_{b}'$ may denote the many-to-one function that maps LLR updates to variable nodes with circulant weight greater than 1 within a particular $b^{th}$ layer to a single value. The row update $row\_upd\_vnode_{l,p}^{b}$ denotes the update to $vnode_{l,p}^{b}$ for the $l^{th}$ circulant within the $p^{th}$ row of the $b^{th}$ layer, and the layer update $layer\_upd\_vnode_{b}'$ denotes the accumulated update to $v_{b}'$ within the $b^{th}$ layer.

In some embodiments, the layered decoding operation 900 may scan through P consecutive rows of a particular layer in a loop 902 as provided by lines 2 through 19 of the decoding operation 900. In each iteration of the loop 902, the $p^{th}$ row of the P consecutive rows is processed by scanning through the $L_b$ variable nodes in a block 904, which corresponds to lines 3 and 18 of the decoding operation 900. Within the block 904, the LLR value $v_{1,p}^{b}$ of variable node $vnode_{l,p}^{b}$ is updated at lines 5 and 7. At line 10, a check node message (e.g., a scaled min-sum value) $row\_upd\_vnode_{l,p}^{b}$ is calculated using $\alpha \min(|V_{l,p}^{b}|) \Pi \, sign(V_{l,p}^{b})$. In some embodiments, the scaling factor $\alpha$ may have a constant value. In some other embodiments, the scaling factor $\alpha$ may be variable. For example, the scaling factor $\alpha$ may take on different values for different layers. Still further, in some embodiments, the scaling factor $\alpha$ may be determined based on the circulant weight of the submatrices within a particular layer.

With reference to lines 13, 14, and 15 of the layered decoding operation 900, the LLR value $v_{1,p}^{b}$ may be directly computed using $layer\_upd\_vnode_{l,p}^{b}$, when $w(vnode_{l,p}^{b})=1$. With reference to lines 16 and 17 of the decoding operation 900, the row update value $row\_upd\_vnode_{l,p}^{b}$ may be stored in a storage element (e.g., memory or accumulator) when $w(vnode_{l,p}^{b})>1$. As described in greater detail below, storing the row updates $row\_upd\_vnode_{l,p}^{b}$ (e.g., when $w(vnode_{l,p}^{b})>1$) allows the P rows of the $b^{th}$ layer to be processed in parallel, even for sub-matrices that have a circulant weight greater than 1.

After the layered decoding operation 900 completes processing the P rows in the loop 902, at lines 20 to 23, a layer update process may be performed to generate a layer update value $layer\_upd\_vnode_{b}'$ using stored row update values $row\_upd\_vnode_{l,p}^{b}$ and computing the LLR value $v_{b}'$ using the layer update value $layer\_upd\_vnode_{b}'$ for each variable node $vnode_{b}'$ where $w(vnode_{l,p}^{b})>1$. In some embodiments, for a particular variable node $vnode_{b}'$, a layer update value $layer\_upd\_vnode_{b}'$ may be computed by combining the stored row updates $row\_upd\_vnode_{l,p}^{b}$ (e.g., at line 21), where $f(vnode_{l,p}^{b})=v_{b}'$. In an example, the LLR value $v_{b}'$ may be updated using both $row\_upd\_vnode_{l,p1}^{b}$ and $row\_upd\_vnode_{l,p2}^{b}$. At line 22, the LLR value $v_{b}'$ may be updated using the layer update value $layer\_upd\_vnode_{b}'$. In some embodiments, the results of the $b^{th}$ layer may be used in the processing of another layer in the layered decoding operation 900.

Figure 10:
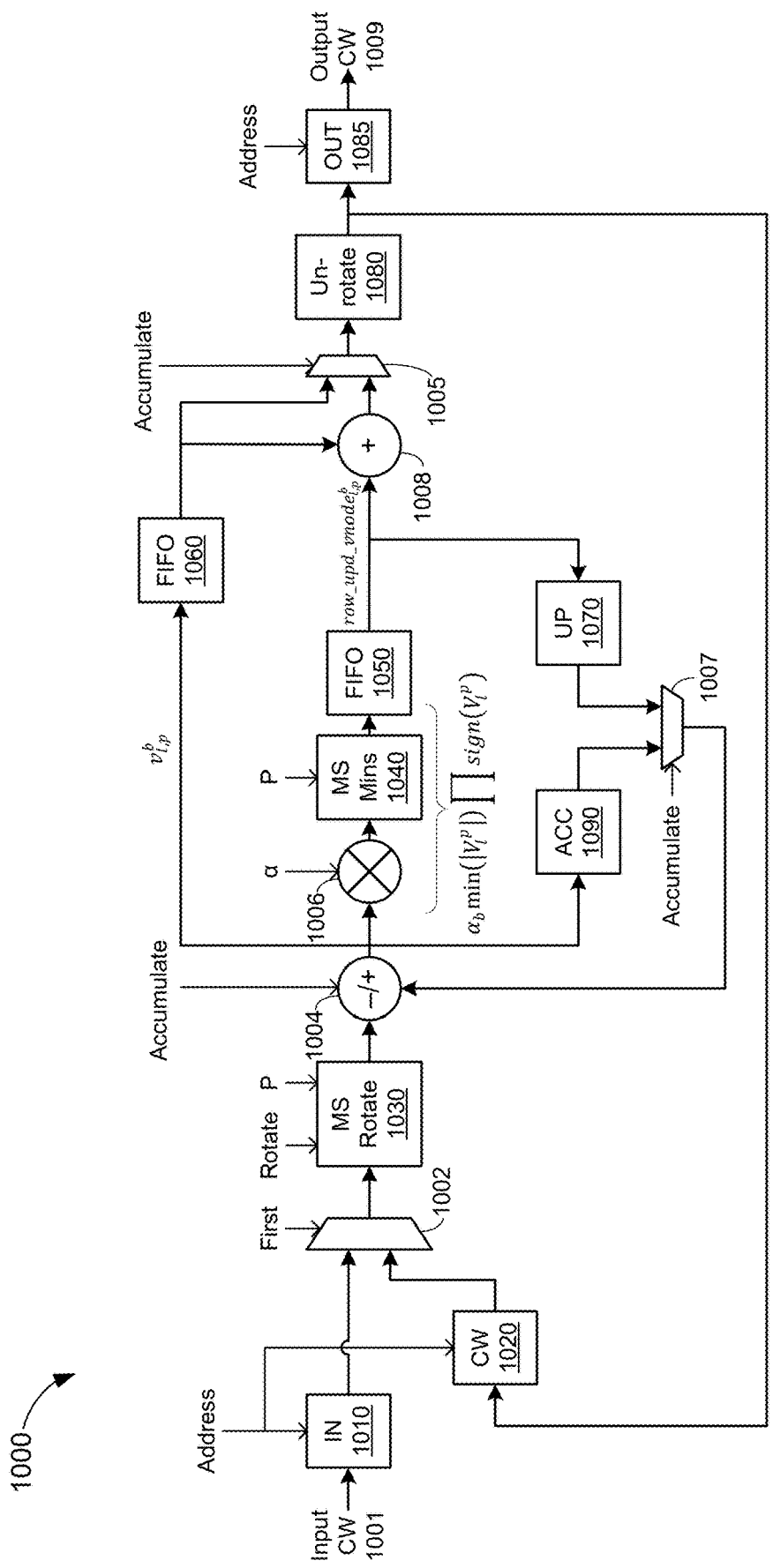
FIG. 10 is a block diagram of a programmable LDPC decoder, in accordance with some other embodiments.

FIG. 10 is a block diagram of a programmable LDPC decoder 1000, in accordance with some other embodiments. The programmable LDPC decoder 1000 may be an example embodiment of the LDPC decoder 530 of FIG. 5. In some embodiments, the LDPC decoder 1000 may be dynamically configured (and reconfigured) to perform LDPC decoding operations in accordance with one or more LDPC codes stored in an LDPC repository (such as the LDPC repository 700 of FIG. 7). For example, the LDPC decoder 1000 may implement a parity-check matrix associated with a selected LDPC code based on LDPC control data provided by the LDPC repository. In some embodiments, the LDPC decoder 1000 may be configured to process multiple circulants of the parity-check matrix in parallel. In some aspects, one or more of the circulants may have a circulant weight greater than 1.

The LDPC decoder 1000 includes an input (IN) buffer 1010, a codeword (CW) buffer 1020, a multi-size (MS) rotator 1030, an MS minimum generator 1040, first-in first-out (FIFO) buffers 1050 and 1060, an update (UP) buffer 1070, an un-rotator 1080, an output (OUT) buffer 1085, and an accumulator 1090. In some embodiments, the buffers 1010, 1020, 1070, and 1085 may correspond to random access memory (RAM). However, in actual implementations, any type of data storage device may be used to implement the buffers 1010, 1020, 1070, and 1085. In some implementations, the buffers 1010, 1020, and/or 1085 may be combined in various ways. For example, in some aspects, the input buffer 1010, CW buffer 1020, and/or output buffer 1085 may be combined to reduce the amount of time spent reading and writing input and output data between the buffers.

The input buffer 1010 may receive and store an input codeword (CW) 1001 to be decoded. In some embodiments, one or more of the buffers 1010, 1020, and/or 1085 may be partitioned into a number (NMB) of memory banks to enable parallel decoding operations to be performed on LLRs associated with multiple columns of the input codeword 1001. For example, the width of the input buffer 1010 may be equal to a number (M) of LLRs. Thus, each individual memory bank may have a width equal to m, where m=M/NMB. In some aspects, the LLRs of the input codeword 1001 may be stored across the plurality of memory banks in a round-robin fashion. During each processing cycle of the LDPC decoding operation, each memory bank may output up to m LLRs (e.g., for a maximum of M LLRs that can be output in parallel by the input buffer 1010).

At runtime, the input buffer 1010 may receive LDPC control data (e.g., Address) from the LDPC repository indicating the memory addresses of selected LLRs that participate in the current layer of decoding. The selected LLRs may be provided as inputs to a multiplexer 1002 which selectively outputs the LLRs from the input buffer 1010 (or from the CW buffer 1020) to the MS rotator 1030 based on LDPC control data (e.g., First) received from the LDPC repository. In some embodiments, the multiplexer 1002 may output the LLRs from the input buffer 1010 only if the LLRs are being used for the first time in the decoding operation (e.g., First=1). For any subsequent circulant operations performed on the same set of the LLRs within the same layer (e.g., First=0), the multiplexer 1002 may output updated LLR values from the CW buffer 1020 instead. In some other embodiments, the multiplexer 1002 may output the LLRs from the input buffer 1010 for each of the circulant operations (e.g., when the CW buffer 1020 is combined or integrated with the input buffer 1010).

The MS rotator 1030 receives the LLRs from the multiplexer 1002 and rotates the received LLRs based on LDPC control data (e.g., Rotate and P) received from the LDPC repository. For example, the MS rotator 1030 may shift or rotate the LLRs stored in memory to coincide with the rotation(s) of the circulant sub-matrices to be applied in the current processing cycle (e.g., so that the circulant operations can be performed on the LLRs in the correct order). The MS rotator 1030 may determine the size of the rotation(s) to be applied to the LLRs based at least in part on the rotation (e.g., Rotate) and sub-matrix size (e.g., P) of the circulants. In some embodiments, the MS rotator 1030 may be configured to perform multiple rotations, concurrently, on the received LLRs based on the number of circulants that are packed into the current processing cycle.

The rotated LLRs may be combined, by a subtractor circuit 1004, with outputs from either the update buffer 1070 or the accumulator 1090. In some aspects, a multiplexer 1007 may selectively output data stored in either the output buffer 1070 or the accumulator 1090 based on an Accumulate signal. In some embodiments, the Accumulate signal may be provided (e.g., as LDPC control data) from the LDPC repository. For example, when processing sub-matrices having a circulant weight greater than 1, each layer of the decoding operation may be subdivided into one or more "calculation" layers (where multiple circulant operations associated with a single sub-matrix are performed and their results stored in memory) and an "accumulate" layer (where the results are added and combined into a single result that is written back to memory for the associated sub-matrix). However, it is noted that in some implementations the accumulate operations may be combined with the calculate operations in a single layer. During the calculation layers (e.g., Accumulate=0), the multiplexer 1007 may provide the output of the accumulator 1090 to the subtractor circuit 1004. In some embodiments, the subtractor circuit 1004 may subtract the output of the MS rotator 1030 from the output of the accumulator 1090 (e.g., as described in lines 4-7 of the layered decoding operation 900 of FIG. 9).

In some aspects, the resulting LLRs $v_{l,p}^b$ may be buffered by the FIFO 1060. In some other aspects, the resulting LLRs $v_{l,p}^b$ may be written back into the accumulator 1090. Still further, in some aspects, the MS minimum generator 1040 may compute the extrinsic minimum values of the LLRs $v_{l,p}^b$ (e.g., by computing $\min(|V_i^p|)\Pi\text{sign}(V_i^p)$ as described in line 10 of the layered decoding operation 900 of FIG. 9). In some embodiments, the MS minimum generator 1040 may be configured to compute multiple extrinsic minimum values, concurrently, for different sets of LLRs based on the number of circulants that are packed into the current processing cycle. Accordingly, the MS minimum generator 1040 may further facilitate the processing of multiple circulants of the parity-check matrix in parallel (e.g., in a single processing cycle). In some aspects, a multiplier 1006 may apply a scaling factor (ab) to the extrinsic minimum values $\min(|V_i^p|)$ to generate scaled extrinsic minimum values, which correspond to row update messages (row_upd_vnode$_{l,p}^b$) for the current layer being processed. It is noted that each of the row update messages row_upd_vnode$_{l,p}^b$, may correspond to respective row update values row_upd_vnode$_{l,p}^b$ of FIG. 9.

The row update messages row_upd_vnode$_{l,p}^b$ output by the MS minimum generator 1040 may be buffered by the FIFO 1050. In some embodiments, the FIFO 1050 may be configured to store (for each layer) sign($V_i^p$), the $\Pi$sign ($V_i^p$), and the two lowest "minima" calculated for min ($|V_i^p|$). For example, the first minimum may correspond to the lowest magnitude calculated across all $V_i^p$ and the second minimum may correspond to the second-lowest magnitude calculated across all $V_i^p$. Aspects of the present disclosure recognize that the magnitude of row_upd_vnode$_{l,p}^b$ may correspond to the first minimum or the second minimum, depending on whether the value $V_i^p$ excluded from the min-sum calculation corresponds to the first minimum. Thus, in some embodiments, row_upd_vnode$_{l,p}^b$, may be reconstructed at the output of the FIFO 1050 based on the values stored for each layer. For example, the sign of row_upd_vnode$_{l,p}^b$, may be determined based on the product of sign($V_i^p$) and $\Pi$sign($V_i^p$), and the magnitude of row_upd_vnode$_{l,p}^b$ may correspond to the first minimum or the second minimum stored therein (e.g., depending on the value $V_i^p$ excluded from the min-sum calculation).

In some aspects, the FIFO 1050 may output the row update messages row_upd_vnode$_{l,p}^b$ to the update buffer 1070, where the row update messages row_upd_vnode$_{l,p}^b$ are subsequently stored (e.g., for use in the next layer or calculation layer of the decoding operation). In some other aspects, the row update messages row_upd_vnode$_{l,p}^b$ may be selectively combined, by an adder circuit 1008, with the LLRs $v_{l,p}^b$ stored in the FIFO 1060. For example, a multiplexer 1005 may selectively output the LLRs $v_{l,p}^b$ from the adder 1008 (or 0) based on the Accumulate signal. During the calculation layers (e.g., Accumulate=0), the multiplexer 1005 provides the LLRs $v_{l,p}^b$ from the adder 1008 to the un-rotator 1080. The un-rotator 1080 may undo the rotation applied by the MS rotator 1030 so that the resulting LLRs $v_{l,p}^b$ can be returned to memory in their original positions. In some implementations, the un-rotator 1080 may be bypassed or excluded from the LDPC decoder 1000. The resulting LLRs $v_{l,p}^b$ may then be stored in the CW buffer 1020. As a result, the row update messages row_upd_vnode$_{l,p}^b$ may be accumulated by the next accumulate layer (e.g., as described in line 17 of the layered decoding operation 900 of FIG. 9).

During the accumulation layer (e.g., Accumulate=1), the results of the circulant operations from each of the calculation layers are added together and stored in memory. For example, the multiplexer 1007 may provide the output of the accumulator 1090 to the subtractor/adder circuit 1004 and the multiplexer 1005 may provide the output of the FIFO 1060 to the un-rotator 1080. More specifically, the subtractor/adder circuit 1004 may add the combined update messages to the LLRs $v_{l,p}^b$ (e.g., as described in lines 20-22 of the layered decoding operation 900 of FIG. 9). In some aspects, the resulting LLRs $v_{l,p}^b$ may be stored in the CW buffer 1020 (e.g., for use in the next layer of the decoding operation). In some other aspects, the resulting LLRs $v_{l,p}^b$ may be stored in the output buffer 1085 as part of an output codeword 1009. In some embodiments, the output buffer 1085 may receive LDPC control data (e.g., Address) from the LDPC repository indicating the memory addresses of selected LLRs stored in the output buffer 1085. The selected LLRs may be output from the output buffer 1085 as the output codeword 1009.

FIG. 11 shows an example configuration of an LDPC repository, in accordance with some other embodiments. The LDPC repository 1100 may represent an example configuration of the LDPC repository 520 of FIG. 5. In some embodiments, the LDPC repository 1100 may be configured to store parity-check information describing parity-check matrices for one or more LDPC codes. In some aspects, at least some of the parity-check information stored in the LDPC repository 1100 may be specific or unique to a particular LDPC code. In some other aspects, at least some of the parity-check information stored in the LDPC repository 1100 may be common or shared among multiple LDPC codes. In the example of FIG. 11, the LDPC repository 1100 includes an LDPC code register 1110 and a shared layer (LA) register 1130. In actual implementations, the LDPC repository 1100 may include additional shared registers such as, for example, a shared scaling factor register and/or a shared circulant register (not shown for simplicity).

The LDPC code register 1110 may be configured to store code-specific parameters for one or more LDPC codes. Each row of the LDPC code register 1110 may be associated with a different parameter 1112 of the LDPC code. Example parameters 1112 include, but are not limited to, the number of codeword bits (N), the number of information bits (K), the size of each sub-matrix (P), the number of layers in the base matrix (NLAYERS), the total number of circulant operations in the base matrix (NMQC), whether normalization is to be applied (NORM_TYPE). The parameters 1110 may also include pointers to one or more shared registers. For example, the LDPC code register 610 may store a pointer to a shared SC register (SC_OFF), a pointer to the shared LA register 630 (LA_OFF), and/or a pointer to a shared QC register (QC_OFF). Each column of the LDPC code register 1110 may be associated with a different code index 1114. For example, the code-specific parameters for a particular LDPC code may be stored in the appropriate rows for the given index (e.g., 0-n). In the example of FIG. 11, the rows associated with index 0 of the LDPC code register 1110 are populated with parity-check information describing the base matrix 600A of FIG. 6A.

The shared LA register 1130 may be configured to store layer information describing the number of operations to be performed on each layer of the base matrix. Data in the shared LA register 1130 may be organized in a plurality of columns 1132-1136. The first column stores an LA index 1132 for a corresponding set of layer information. The second column stores a stall value 1134 indicating the number of cycles (e.g., 0-255) to wait at the start of a layer to enforce data dependencies. The third column of the LA register 1130 stores an accumulate value 1136 indicating whether the current layer of the base matrix is an accumulate layer for a sub-matrix having a circulant weight greater than 1. The fourth column of the LA register 1130 stores a CPLD value 1136 indicating the number of processing cycles per layer. In some embodiments, the parity-check information stored by the LA register 1130 may be shared or reused by multiple LDPC codes. For example, two or more LDPC codes stored in the LDPC code register 1110 may use the same layer information, and may thus point to the same LA index 1132 in the shared LA register 1130.

Figure 12:
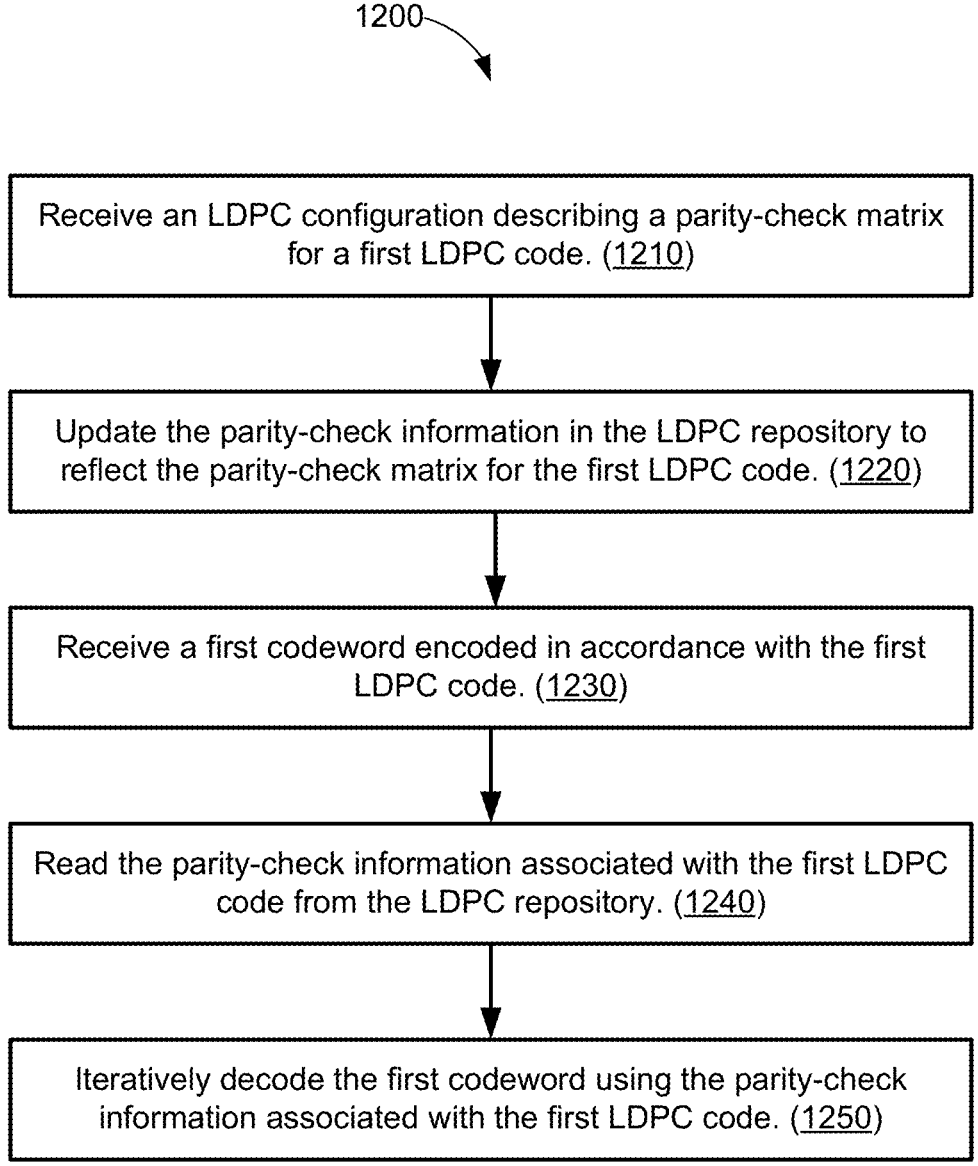
FIG. 12 is an illustrative flow chart depicting an example operation of a programmable LDPC decoder, in accordance with some embodiments.

FIG. 12 is an illustrative flow chart depicting an example operation 1200 of a programmable LDPC decoder, in accordance with some embodiments. Although described below with respect to the decoder circuit 500 of FIG. 5, the example operation 1200 may be performed by any suitable decoder circuit.

The decoder circuit 500 may receive an LDPC configuration describing a parity-check matrix for a first LDPC code (1210). For example, the decoder circuit 500 may receive an LDPC configuration describing a parity-check matrix for an LDPC code. The LDPC configuration may describe or otherwise indicate the bit values (e.g., "1" or "0") in each column and each row of the associated parity-check matrix, as well as the number of information bits and/or parity bits in each LDPC codeword associated with the parity-check matrix.

The decoder circuit 500 may then update the parity-check information in the LDPC repository to reflect the parity-check matrix for the first LDPC code (1220). For example, the decoder circuit 500 may store the LDPC configuration as a set of parameterized data (e.g., parity-check information) in the LDPC repository. In some aspects, the parity-check information may provide a high-level description of the associated parity-check matrix (such as codeword length, number of information bits, circulant size, number of layers, and the like).

The decoder circuit 500 may further receive a first codeword encoded in accordance with the first LDPC code (1230). For example, the decoder circuit 500 may implement a parity-check matrix based on the parity-check information stored in the LDPC repository. In some embodiments, the decoder circuit 500 may use the parity-check matrix to decode the received codeword.

The decoder circuit 500 may then read the parity-check information associated with the first LDPC code from the LDPC repository (1240). In some embodiments, the decoder circuit 500 may read or retrieve a particular set of parity-check information from the LDPC repository based on the received input codeword. For example, a different code index may be provided to the LDPC repository for different codewords (e.g., depending on the LDPC code used to encode the codeword).

The decoder circuit 500 may iteratively decode the first codeword using the parity-check information associated with the first LDPC code (1250). For example, the LDPC decoder 530 may check each bit of the input codeword 506 against the parity-check matrix, update the values for the selected bits based on the parity-check operations, and output the bits (e.g., bits that have either passed or been corrected by the parity-check operations) as an output codeword 508.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A decoder circuit for a communication device, comprising:
    a low-density parity-check (LDPC) repository to store parity-check information associated with one or more quasi-cyclic (QC) LDPC codes, wherein the LDPC repository includes a code register storing a plurality of entries, the entries including a plurality of codeword length entries, a plurality of information bit size entries, a plurality of circulant submatrix size entries, and a plurality of base matrix layer number entries;
    an LDPC code configurator to receive a first LDPC configuration indicating a codeword length, an information bit size, a circulant submatrix size, and a base matrix layer of a parity-check matrix, the parity-check matrix representing a base matrix and a plurality of circulant sub-matrices for a first QC LDPC code and to update the parity-check information in the LDPC repository to reflect the parity-check matrix for the first QC LDPC code by:
        determining that one or more pointers in the received first LDPC configuration correspond to one or more first entries in the code register, the one or more first entries indicating the codeword length, the information bit size, the circulant submatrix size, and the base matrix layer of the parity-check matrix of the first QC LDPC code; and
        updating the parity-check information to reflect contents of the one or more first entries in the code register; and
    LDPC decoding circuitry to receive, via a communications channel, a first codeword encoded in accordance with the first QC LDPC code, the LDPC decoding circuitry configured to:
        read the parity-check information associated with the first QC LDPC code from the LDPC repository;
        configure the LDPC decoding circuitry, using information in the one or more first entries in the code register, to decode LDPC codewords encoded using the first QC LDPC code;
        iteratively decode the first codeword, at least in part, by detecting and correcting one or more errors introduced by the communications channel; and
        transmit the decoded first codeword to another circuit associated with the communication device.

2. The decoder circuit of claim 1, wherein the LDPC repository includes:
    a circulant register to store the parity-check information describing the plurality of circulant sub-matrices; and
    a layer register to store the parity-check information describing a number of circulant sub-matrices associated with each layer of the base matrix.

3. The decoder circuit of claim 2, wherein the parity-check information stored in at least one of the circulant register or the layer register is shared by a plurality of QC LDPC codes represented by the LDPC repository.

4. The decoder circuit of claim 1, wherein the LDPC decoding circuitry comprises:
    circulant packing circuitry to update a portion of the first codeword using multiple circulant sub-matrices of the first QC LDPC code, concurrently, in a single processing cycle.

5. The decoder circuit of claim 1, wherein the LDPC decoding circuitry comprises:
    circulant reuse circuitry to update a portion of the first codeword using a single circulant sub-matrix of the first QC LDPC code over multiple processing cycles.

6. The decoder circuit of claim 1, wherein at least one of the circulant sub-matrices of the first QC LDPC code has a circulant weight greater than 1.

7. The decoder circuit of claim 1, wherein the LDPC code configurator is further configured to receive a second LDPC configuration describing a parity-check matrix for a second QC LDPC code and to update the parity-check information in the LDPC repository to reflect the parity-check matrix for the second QC LDPC code.

8. The decoder circuit of claim 7, wherein the LDPC decoding circuitry is further configured to receive a second codeword encoded in accordance with the second QC LDPC code, the LDPC decoding circuitry configured to:
    read the parity-check information associated with the second QC LDPC code from the LDPC repository; and
    iteratively decode the second codeword using the parity-check information associated with the second QC LDPC code.

9. A method, performed by a decoder circuit for a communication device, the method comprising:
    receiving a first LDPC configuration indicating a codeword length, an information bit size, a circulant submatrix size, and a base matrix layer of a parity-check matrix for a first quasi-cyclic (QC) LDPC code, wherein the parity-check matrix is represented by a base matrix and a plurality of circulant sub-matrices;
    updating parity-check information in an LDPC repository to reflect the parity-check matrix for the first QC LDPC code, wherein updating the parity-check information in the LDPC repository includes:
        determining that one or more pointers in the first LDPC configuration correspond to one or more first entries in a code register of the LDPC repository, the one or more first entries indicating the codeword length, the information bit size, the circulant submatrix size, and the base matrix layer of the parity-check matrix of the first LDPC code, wherein the code register includes a plurality of entries, the entries including a plurality of codeword length entries, a plurality of information bit size entries, a plurality of circulant submatrix size entries, and a plurality of base matrix layer number entries; and
        updating the parity-check information to reflect contents of the one or more first entries in the code register;
    receiving, via a communications channel, a first codeword encoded in accordance with the first QC LDPC code;
    reading the parity-check information associated with the first QC LDPC code from the LDPC repository;

configuring LDPC decoding circuitry, using the parity-check information associated with the first LDPC code, to decode LDPC codewords encoded using the first QC LDPC code;

iteratively decoding the first codeword using the configured LDPC decoding circuitry, wherein iteratively decoding the first codeword includes detecting and correcting one or more errors introduced by the communications channel; and transmitting the decoded first codeword to another circuit associated with the communication device.

10. The method of claim 9, wherein the updating comprises:

storing, in a circulant register of the LDPC repository, the parity-check information describing the plurality of circulant sub-matrices; and storing, in a layer register of the LDPC repository, the parity-check information describing a number of circulant sub-matrices associated with each layer of the base matrix.

11. The method of claim 10, wherein the parity-check information stored in at least one of the circulant register or the layer register is shared by a plurality of QC LDPC codes represented by the LDPC repository.

12. The method of claim 9, wherein the decoding comprises:

updating a portion of the first codeword using multiple circulant sub-matrices of the first QC LDPC code, concurrently, in a single processing cycle.

13. The method of claim 9, wherein the decoding comprises:

updating a portion of the first codeword using a single circulant sub-matrix of the first QC LDPC code over multiple processing cycles.

14. The method of claim 9, wherein at least one of the circulant sub-matrices of the first QC LDPC code has a circulant weight greater than 1.

15. The method of claim 9, further comprising:

receiving a second LDPC configuration describing a parity-check matrix for a second QC LDPC code; and updating the parity-check information in the LDPC repository to reflect the parity-check matrix for the second QC LDPC code.

16. The method of claim 15, further comprising:

receiving a second codeword encoded in accordance with the second QC LDPC code; reading the parity-check information associated with the second LDPC code from the LDPC repository; and iteratively decoding the second codeword using the parity-check information associated with the second QC LDPC code.

* * * * *